United States Patent
Igarashi et al.

(10) Patent No.: US 6,395,588 B2
(45) Date of Patent: May 28, 2002

(54) COMPOUND SEMICONDUCTOR DEVICE AND METHOD OF MANUFACTURING THE SAME

(75) Inventors: Tsutomu Igarashi; Kenji Arimochi; Teruo Yokoyama; Eizo Mitani; Shigeru Kuroda; Junichiro Nikaido; Yasunori Tateno, all of Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/880,867

(22) Filed: Jun. 15, 2001

Related U.S. Application Data

(63) Continuation of application No. 09/330,085, filed on Jun. 11, 1999, now Pat. No. 6,274,893.

(30) Foreign Application Priority Data

Jun. 15, 1998 (JP) .......................................... 10-166734
Jul. 31, 1998 (JP) .......................................... 10-217833

(51) Int. Cl.$^7$ .......................................... H01L 21/338
(52) U.S. Cl. ........................ 438/172; 438/572; 438/574; 438/576
(58) Field of Search ................................ 438/172, 167, 438/182, 572, 573, 574, 576, 579

(56) References Cited

U.S. PATENT DOCUMENTS 5,140,386 A    8/1992   Huang et al.
5,250,822 A   10/1993   Sonoda et al. ............... 257/194
5,276,340 A *  1/1994   Yokoyama et al. ......... 257/194
5,686,325 A * 11/1997   Moriuchi et al. ........... 438/571
5,949,095 A *  9/1999   Nagahara et al. ........... 257/192
5,959,317 A    9/1999   Niwa .......................... 257/194
6,057,566 A    5/2000   Eisenbeiser et al. ........ 257/194
6,075,262 A *  6/2000   Moriuchi et al. ........... 257/280
6,144,048 A   11/2000   Suemitsu et al. ........... 257/192
6,144,049 A   11/2000   Onda .......................... 257/194
6,153,897 A * 11/2000   Oguri et al. ................. 257/194

FOREIGN PATENT DOCUMENTS

JP          05-251471        9/1993
JP          09-008283        1/1997

OTHER PUBLICATIONS

T, Kunii, et al., 1997 IEEE MTT–S Digest, pp. 1187–1190.
Bito, et al., 1998 IEEE MTT–S Digest, pp. 439–442.

* cited by examiner

Primary Examiner—Kevin M. Picardat
(74) Attorney, Agent, or Firm—Armstrong, Westerman & Hattori, LLP

(57) ABSTRACT

The impurity concentration contained in a layer on an electron supply layer of a high electron mobility field effect transistor is set in the range of $1\sim10^{16}$ to $1\sim10^{17}$ atoms/cm$^3$, or the bandgap of a Schottky layer is set wider than that of the electron supply layer. Otherwise, in the steps of manufacturing the high electron mobility field effect transistor, after a silicon nitride film has been formed on a GaAs buried layer in which a second recess is formed and in a region on the inside of a first recess formed in a GaAs contact layer, the GaAs buried layer is still heated.

4 Claims, 29 Drawing Sheets

RECESS LENGTH
○— 0.2 um
●— 0.5 nm
×— 1.0 um
△— 1.5 um

COMPOUND SEMICONDUCTOR DEVICE AND METHOD OF MANUFACTURING THE SAME

This application is a continuation of prior application Ser. No. 09/330,085, filed Jun. 11, 1999, now U.S. Pat. No. 6,274,893.

BACKGROUND OF THE INVENTION

1. Field of the Invention

The present invention relates to a compound semiconductor device and a method of manufacturing the same and, more particularly, a compound semiconductor device having a Schottky gate such as a high electron mobility transistor, a metal semiconductor field effect transistor, etc. and a method of manufacturing the same.

2. Description of the Prior Art

As a compound semiconductor device having a Schottky gate, there have been known a high electron mobility transistor (HEMT), a metal semiconductor field effect transistor (MESFET), and the like.

In such compound semiconductor devices, reduction in an influence of surface states upon a surface depletion layer and control of a threshold voltage of a transistor have been achieved by providing a recessed structure in a compound semiconductor layer which is located in a gate electrode connection portion and its peripheral area.

The field effect transistor employing the recessed structure has been set forth in, e.g., ① IEEE MTT-S Digest (1997) pp 1187–1190, ② IEEE MTT-S Digest (1998) pp 439–442, ③ Patent Application Publication (KOKAI) Hei 5-129341, ④ Patent Application Publication (KOKAI) Hei 5-251471, ⑤ Patent Application Publication (KOKAI) Hei 9-8283, and the like.

For example, the HEMT set forth in the reference ① has a structure shown in FIG. 1.

In FIG. 1, an undoped AlGaAs buffer layer 102, an $n^+$-AlGaAs first electron supply layer 103, an undoped AlGaAs first spacer layer 104, an undoped InGaAs channel layer 105, an undoped AlGaAs second spacer layer 106, an $n^+$-AlGaAs second electron supply layer 107, an undoped AlGaAs Schottky layer 108, an $n^-$-GaAs intermediate layer (buried layer) 109, and an $n^+$-GaAs cap layer 110 are formed in sequence on a semi-insulating GaAs substrate 101. An AlGaAs layer 111 is formed between the $n^+$-GaAs cap layer 110 and the $n^-$-GaAs intermediate layer 109.

A first recess 112 is formed in the cap layer 110 to expose the intermediate layer 109 in the periphery of a gate region. In addition, a second recess 114 is formed in the intermediate layer 109 to bury a lower portion of a gate electrode 113 made of tungsten silicide (WSi). The first recess 112 and the second recess 114 are formed to adjust a depth of a surface depletion layer.

A gold (Au) layer 115 is connected to the gate electrode 113 to reduce its resistance value.

The cap layer 110 is separated into a source side and a drain side on both sides of the gate electrode 113 by the first recess 112. A source electrode 116s and a drain electrode 116d, both being ohmic-connected to the cap layer 110, are formed on the cap layer 110 which has remained on the source side and the drain side respectively. In this case, a distance L from an edge of the first recess 112 to an edge of the second recess 114 between the drain electrode 116d and the gate electrode 113 is referred to as a recess length hereinafter.

In such HEMT, carriers supplied from the drain electrode 116d come up to the channel layer 105 via the cap layer 110, . . . , the second spacer layer 106, etc. Then, the carriers travel in the channel layer 105 from the lower side of the drain electrode 116d to the lower side of source electrode 116s by the electric field. Then, the carriers come up to the source electrode 116s via the second spacer layer 106, . . . , the cap layer 110. Travel of the carriers in the channel layer 105 can be controlled by a depletion layer which spreads out from the gate electrode 113 when voltage is applied.

By the way, in the HEMT having the above structure, a sufficient gate breakdown voltage has not been able to be achieved since, if the backward bias voltage is applied to the gate electrode 113, a phenomenon that a leakage current is increased gradually with the lapse of application time, i.e., a walk-out phenomenon, is caused.

Moreover, control of the gate forward bias has not been able to be sufficiently performed.

Besides, the fact that, if the recess length is less than 1 $\mu$m, a high power added efficiency cannot be maintained has been confirmed according to the experiment done by the inventors of the present invention.

SUMMARY OF THE INVENTION

It is an object of the present invention to provide a compound semiconductor device which is capable of improving a breakdown voltage while suppressing generation of a walk-out phenomenon and also maintaining a high power added efficiency even if a recess length in a region between a gate electrode and a cap layer is set to 1 $\mu$m or less, and a method of manufacturing the same.

(1) The above problems can be overcome by providing a compound semiconductor device which comprises a channel layer formed on a compound semiconductor substrate, and formed of material which has a first donor concentration and a first bandgap; a carrier supply layer formed on the channel layer, and formed of material which has a second donor concentration being higher than the first donor concentration and a second bandgap being wider than the first bandgap; a first compound semiconductor layer formed on the carrier supply layer, and containing donors in at least one of a lower layer portion and an upper layer portion within a range of impurity concentration of $1 \times 10^{16}$ to $1 \times 10^{17}$ atoms/cm$^3$; a gate electrode connected to the first compound semiconductor layer; a cap layer formed on the first compound semiconductor layer in a source region and a drain region which are formed on both sides of the gate electrode, and formed of material which has a third donor concentration being higher than the first donor concentration and a third bandgap being narrower than the second bandgap; a source electrode at least a part of which is formed on the cap layer in the source region; and a drain electrode at least a part of which is formed on the cap layer in the drain region.

According to the compound semiconductor device of the present invention, the first compound semiconductor layer whose donor concentration is set to $1 \times 10^{16}$ atoms/cm$^3$ to $1 \times 10^{17}$ atoms/cm$^3$ is provided between the cap layer and the carrier supply layer.

According to the donor of such concentration, the holes being separated in the channel layer can be prevented from reaching the surface of the first compound semiconductor layer, whereby contraction of the surface depletion layer can be suppressed and thus generation of the walk-out phenomenon can be prevented.

In this case, since the donor concentration is set to less than $1 \times 10^{17}$ atoms/cm$^3$, the situation that the gate breakdown voltage is easily reduced because of high concentration of donor in the first compound semiconductor layer cannot be brought about.

(2) The above problems can be overcome by providing a compound semiconductor device which comprises a channel layer formed on a compound semiconductor substrate, and formed of material which has a first donor concentration and a first bandgap; a carrier supply layer formed on the channel layer, and formed of material which has a second donor concentration being higher than the first donor concentration and a second bandgap being wider than the first bandgap; a Schottky layer formed on the carrier supply layer, and formed of material which has a third bandgap being wider than the second bandgap; a gate electrode connected to the Schottky layer; a buried layer having a recess in which a part of the gate electrode is buried; a cap layer formed on the Schottky layer in a source region and a drain region which are formed on both sides of the gate electrode, and formed of material which has a third donor concentration being higher than the first donor concentration and a fourth bandgap being narrower than the second bandgap; a source electrode at least a part of which is formed on the cap layer in the source region; and a drain electrode at least a part of which is formed on the cap layer in the drain region.

According to the compound semiconductor device of the present invention, the bandgap of the Schottky layer formed on the carrier supply layer is set higher than that of the carrier supply layer.

Therefore, the energy barrier between the gate electrode and the Schottky layer can be enhanced to thus improve the gate breakdown voltage.

However, if the bandgap of the Schottky layer is enhanced, the ohmic resistance of the source/drain regions is increased. Therefore, while suppressing a total film thickness from the Schottky layer to the cap layer, metal constituting the source/drain electrodes and the semiconductor layers therebelow are alloyed by heating, so that such alloy layer can be easily made to reach the electron supply layer. As a result, the ohmic resistance value can be reduced. However, when such film thickness is adjusted, it is not preferable that the thickness is made too thin to such extent that the surface depletion layer comes up to the carrier supply layer since supply of the carriers to two dimensional carrier gas area is decreased.

(3) The above problems can be overcome by providing a method of manufacturing a compound semiconductor device which comprises the steps of forming a channel layer on a semiconductor substrate; forming a carrier supply layer, which supplies carriers to the channel layer, on the channel layer; forming a Schottky semiconductor layer, which has a gate connection region, on the carrier supply layer; forming a gallium-arsenide buried layer on the Schottky semiconductor layer; forming a gallium-arsenide cap layer on the gallium-arsenide buried layer; forming a first recess in a region containing a gate region by etching a part of the gallium-arsenide cap layer; forming a silicon nitride film in the first recess and on the gallium-arsenide buried layer; heating the gallium-arsenide buried layer which is covered with the silicon nitride film; forming an opening portion by selectively etching the silicon nitride film on the gate connection region; forming a second recess by etching the gallium-arsenide buried layer via the opening portion; forming a gate electrode on the gate connection region of the Schottky semiconductor layer via the second recess; forming a source opening portion and a drain opening portion in the gallium-arsenide cap layer on both sides of the first recess by patterning the silicon nitride film; and forming a source electrode in the gallium-arsenide cap layer via the source opening portion and forming a drain electrode in the gallium-arsenide cap layer via the drain opening portion.

Also, the above problems can be overcome by providing a compound semiconductor device which comprises a channel layer formed on a semiconductor substrate; a carrier supply layer formed on the channel layer; a Schottky semiconductor layer formed on the carrier supply layer and having a gate connection region; a gallium-arsenide buried layer formed on the Schottky semiconductor layer; a gallium-arsenide cap layer formed on the gallium-arsenide buried layer; a first recess formed in the gallium-arsenide cap layer to expose a part of the gallium-arsenide buried layer, and having a width which is wider than the gate connection region; a second recess formed in the gallium-arsenide buried layer to expose the gate connection region of the Schottky semiconductor layer; a silicon nitride film provided in the first recess to extend from an end surface of the second recess onto the gallium-arsenide buried layer and the gallium-arsenide cap layer; a gate electrode connected to the Schottky semiconductor layer in the second recess; and a source electrode and a drain electrode formed on the gallium-arsenide cap layer respectively.

Next, an operation of the present invention will be explained.

According to the invention, the GaAs buried layer is heated after the silicon nitride film has been formed on the GaAs buried layer, in which the second recess is formed, in the region located on the inside of the first recess formed in the cap layer. Therefore, even if the gallium oxide layer and the arsenic layer are generated because the surface of the GaAs buried layer is oxidized, such arsenic layer can be discharged into the outside through the silicon nitride film by heating.

The leakage current is made easily flow since conductivity of the arsenic layer is high, so that the three-terminal breakdown voltage (Vdsx) is caused to reduce. Since the arsenic layer disappears substantially by heating, the three-terminal breakdown voltage (Vdsx) between the drain electrode, the gate electrode, and the source electrode can be increased. The power added efficiency can also be improved since the three-terminal breakdown voltage (Vdsx) can be increased.

As a result, it has been evident experimentally that, even if the interval between the first recess and the second recess is set to less than 1 μm, reduction in the power added efficiency can be prevented.

It is preferable that the heating temperature is set in the range of 500 to 700° C.

DESCRIPTION OF THE PREFERRED EMBODIMENTS

Embodiments of the present invention will be explained in detail with reference to the accompanying drawings hereinafter.

(First Embodiment)

FIGS. 2A to 2H are sectional views showing steps of manufacturing a HEMT according to a first embodiment of the present invention.

Figure 2A:
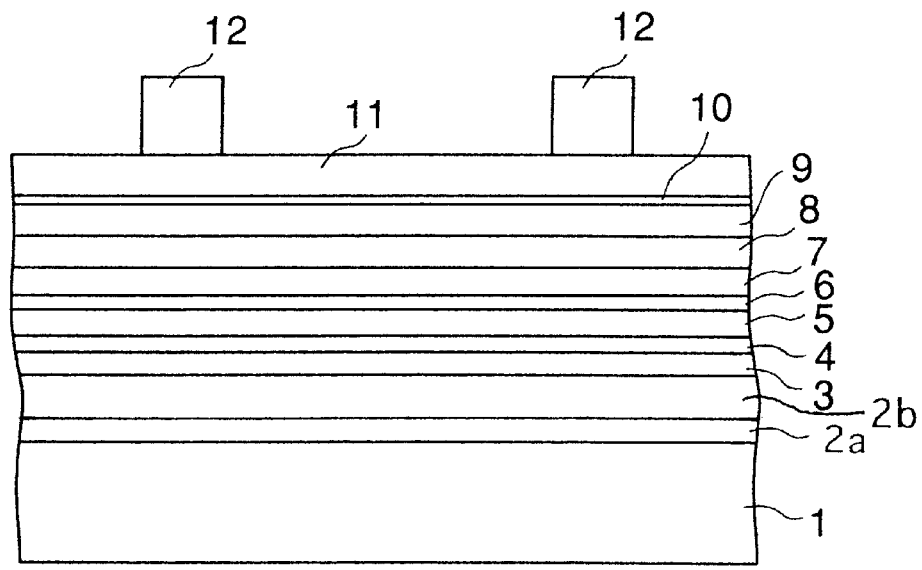
FIGS. 2A to 2H are sectional views showing steps of manufacturing a HEMT according to a first embodiment of the present invention.

First of all, as shown in FIG. 2A, formation of a plurality of compound semiconductor layers, which constitute the HEMT, on a semi-insulating gallium-arsenide (GaAs) substrate 1 will be explained hereinbelow.

In FIG. 2A, a first buffer layer 2a made of undoped GaAs, a second buffer layer 2b made of undoped aluminum-gallium-arsenide (AlGaAs), a first electron supply layer 3 made of $n^+$-AlGaAs, a first spacer layer 4 made of undoped AlGaAs, a channel layer 5 made of undoped indium-gallium-arsenide (InGaAs), a second spacer layer 6 made of undoped AlGaAs, a second electron supply layer (carrier supply layer) 7 made of $n^+$-AlGaAs, a Schottky layer 8 made of undoped AlGaAs, an $n^-$-GaAs buried layer 9, an $n^+$-AlGaAs etching stopper layer 10, and an $n^+$-GaAs cap layer 11 are formed in sequence on a GaAs substrate 1.

As the growth method for the compound semiconductor layers 2 to 11, there are the MOVPE method, the MBE method, and the like. The above term "undoped" does not mean that the impurity is not contained in the semiconductor layer at all, but means that the impurity is not doped in growing the semiconductor layer. These semiconductor layers are formed under the conditions that they can substantially satisfy the lattice matching for respective underlying layers. In this case, it is preferable that a composition ratio of aluminum (Al) in group III elements which are contained in AlGaAs constituting the Schottky layer 8 should be set to more than 0.4 (e.g., 0.5). Thus, the Schottky layer 8 is composed of $Al_xGa_{1-x}As$ (x>0.4). Similarly, it is preferable that a composition ratio of aluminum (Al) in the group III elements which are contained in AlGaAs constituting the etching stopper layer 10 should be set to more than 0.1 (e.g., 0.25). Thus, the etching stopper layer 10 is composed of $Al_yGa_{1-y}As$ (y>0.1).

In addition, a composition ratio of aluminum (Al) in the group III elements which are contained in AlGaAs constituting the first electron supply layer 3, the first spacer layer 4, the second spacer layer 6, and the second electron supply layer 7 is set to 0.1 to 0.3 (e.g., 0.25). Also, a composition ratio of indium (In) in the group III elements which are contained in InGaAs constituting the channel layer 5 is set to 0.1 to 0.3 (e.g., 0.25).

An energy bandgap in AlGaAs becomes wider as the composition ratio of aluminum is increased. According to the larger energy bandgap, the AlGaAs layers are aligned in order of the Schottky layer 8, the etching stopper layer 10, and other AlGaAs layers (the first electron supply layer 3, the first spacer layer 4, the second spacer layer 6, and the second electron supply layer 7).

Next, examples of the film thickness range of the compound semiconductor layers will be explained hereinbelow.

A thickness of the GaAs first buffer layer 2a is about 150 nm, a thickness of the AlGaAs second buffer layer 2b is about 500 nm, a thickness of the AlGaAs first electron supply layer 3 is 3 to 15 nm (e.g., 7 nm), a thickness of the AlGaAs first spacer layer 4 is less than 5 nm (e.g., 2 nm), a thickness of the InGaAs channel layer 5 is 10 to 25 nm (e.g., 14 nm), a thickness of the AlGaAs second spacer layer 6 is less than 5 nm (e.g., 2 nm), a thickness of the AlGaAs second electron supply layer 7 is 10 to 30 nm (e.g., 20 nm), a thickness of the AlGaAs Schottky layer 8 is 1 to 30 nm (e.g., 20 nm), a thickness of the GaAs buried layer 9 is 10 to 70 nm (e.g., 30 nm), a thickness of the AlGaAs etching stopper layer 10 is 1 to 10 nm (e.g., 3 nm), and a thickness of the GaAs cap layer 11 is more than 50 nm (e.g., 80 nm).

As for the impurity concentration of the impurity doped layers, the silicon concentration of the AlGaAs first electron supply layer 3 is $1 \times 10^{18}$ to $3 \times 10^{18}$ atoms/cm$^3$ (e.g., $2 \times 10^{18}$ atoms/cm$^3$), the silicon concentration of the AlGaAs second electron supply layer 7 is $1 \times 10^{18}$ to $3 \times 10^{18}$ atoms/cm$^3$ (e.g., $2 \times 10^{18}$ atoms/cm$^3$), the silicon concentration of the GaAs buried layer 9 is less than $5 \times 10^{17}$ atoms/cm$^3$ (e.g., $5 \times 10^{16}$ atoms/cm$^3$), the silicon concentration of the AlGaAs etching stopper layer 10 is more than 0 (e.g., $2 \times 10^{18}$ atoms/cm$^3$), and the silicon concentration of the GaAs cap layer 11 is more than $1 \times 10^{18}$ atoms/cm$^3$ (e.g., $3 \times 10^{18}$ atoms/cm$^3$). Although the Schottky layer 8 is formed of undoped layer in the above, the silicon may be contained in the Schottky layer 8 at the concentration of less than $5 \times 10^{17}$ atoms/cm$^3$ by the impurity doping from overlying and underlying layers during the impurity diffusion or the film growth. For example, the silicon may be employed as the impurity.

After the growth of the above semiconductor layers has been completed, first resist 12 is coated on the cap layer 11 and then the first resist 12 is left like an island in regions, which define the gate region and the source/drain regions, by exposing and developing the first resist 12.

Figure 2B:
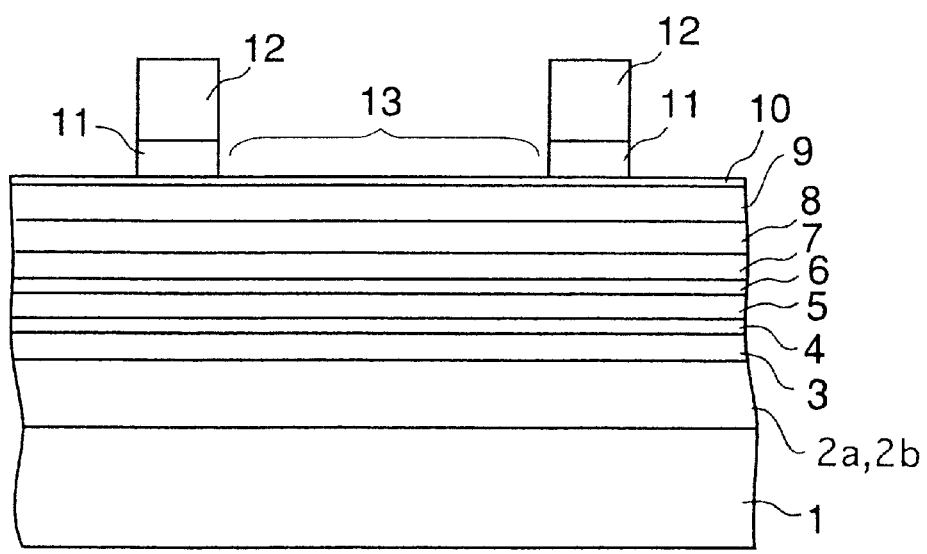

The GaAs cap layer 11 is then etched by using the first resist 12 as a mask to be left like the island, as shown in FIG. 2B.

In this case, if the GaAs cap layer 11 is etched by the plasma etching method using silicon tetrachloride (SiCl$_4$) and sulfur hexafluoride (SF$_6$) as the reaction gas, an etching rate becomes slow rapidly at a point of time when the AlGaAs etching stopper layer 10 formed beneath the GaAs cap layer 11 is exposed. Thus, stop of the etching of the GaAs cap layer 11 can be easily controlled.

A first recess 13 is formed in the source/drain regions on the inside of the GaAs cap layer 11 by the etching. Concave regions are then ensured on the outside of the GaAs cap layer 11 to form the source/drain regions.

Figure 2C:
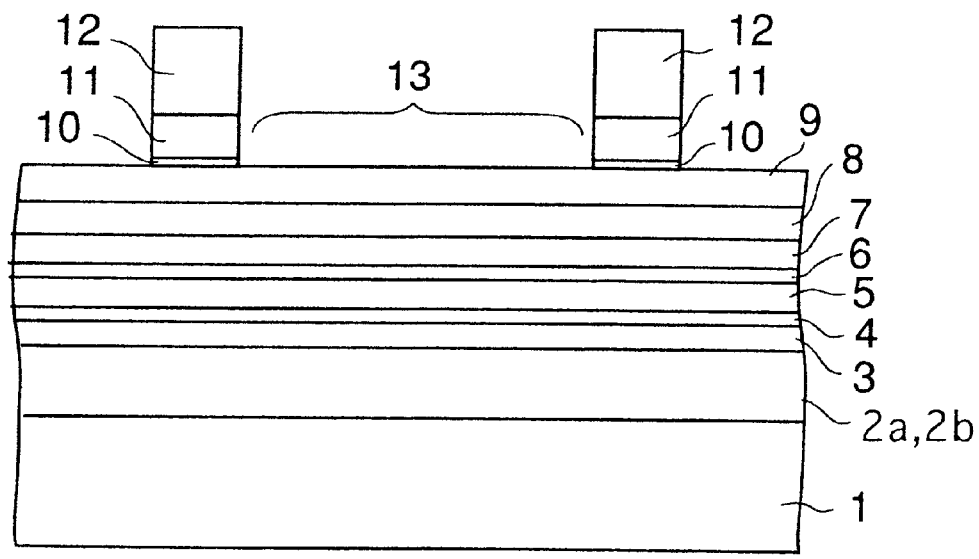

As shown in FIG. 2C, the AlGaAs etching stopper layer 10 exposed from the first recess 13 is then removed by using ammonia, nitric acid, or hydrogen fluoride, for example, while using the first resist 12 as a mask.

Figure 2D:
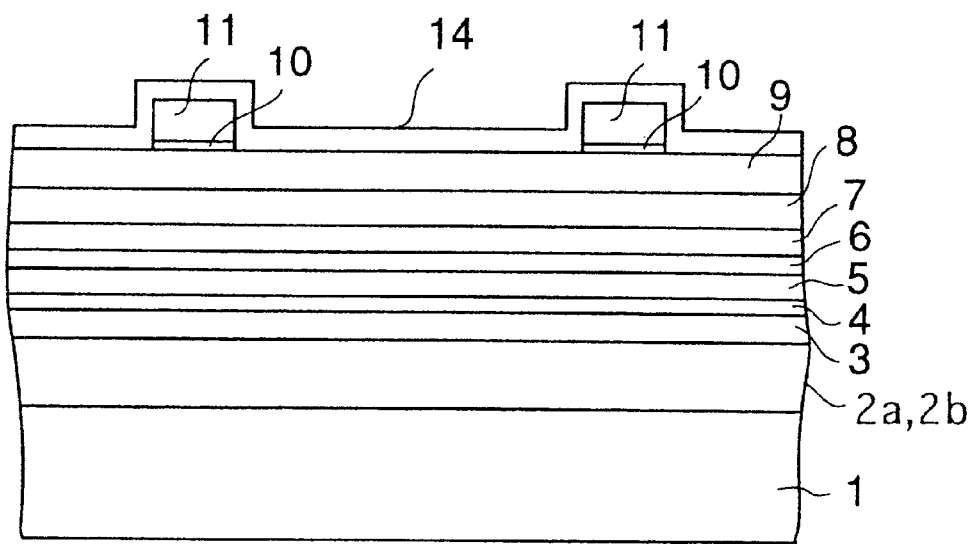

The first resist 12 is then removed and, as shown in FIG. 2D, an insulating film 14 made of silicon oxide (SiO$_2$), silicon nitride (Si$_3$N$_4$), silicon oxide nitride (SiON), or the like is formed by the CVD method to cover the GaAs buried layer 9 and the cap layer 11. Such formation of the insulating film 14 will be explained in detail in the eighth embodiment of the present invention.

Figure 2E:
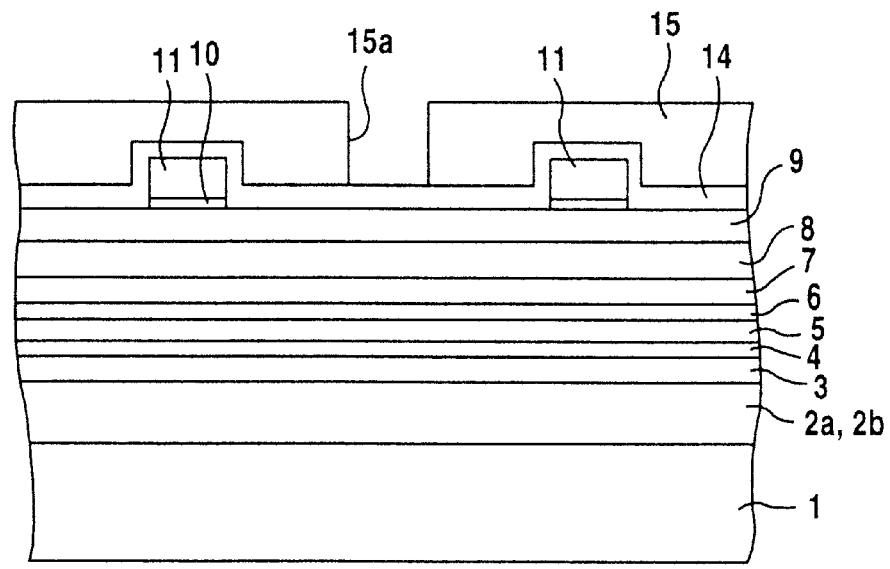

Second resist is then coated on the insulating film 14 and, as shown in FIG. 2E, a window 15a is then formed by exposing and developing the second resist.

Figure 2F:
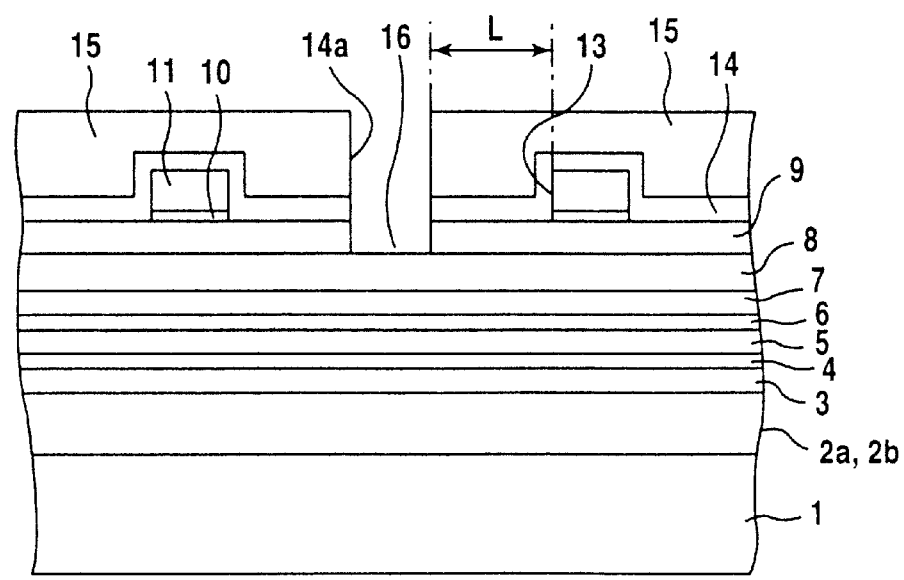

An opening portion 14a is then formed in the gate region by etching the insulating film 14 exposed from the window 15a by virtue of the reactive ion etching method. The GaAs buried layer 9 exposed from the opening portion 14a is then etched, whereby a second recess 16 is formed in the GaAs buried layer 9, as shown in FIG. 2F. This etching in forming the second recess 16 is effected by the plasma etching method using a mixed gas of SiCl$_4$ and SF$_6$.

A distance L between an inner edge portion of the first recess 13 and an outer edge portion of the second recess 16 is a recess length.

Figure 2G:
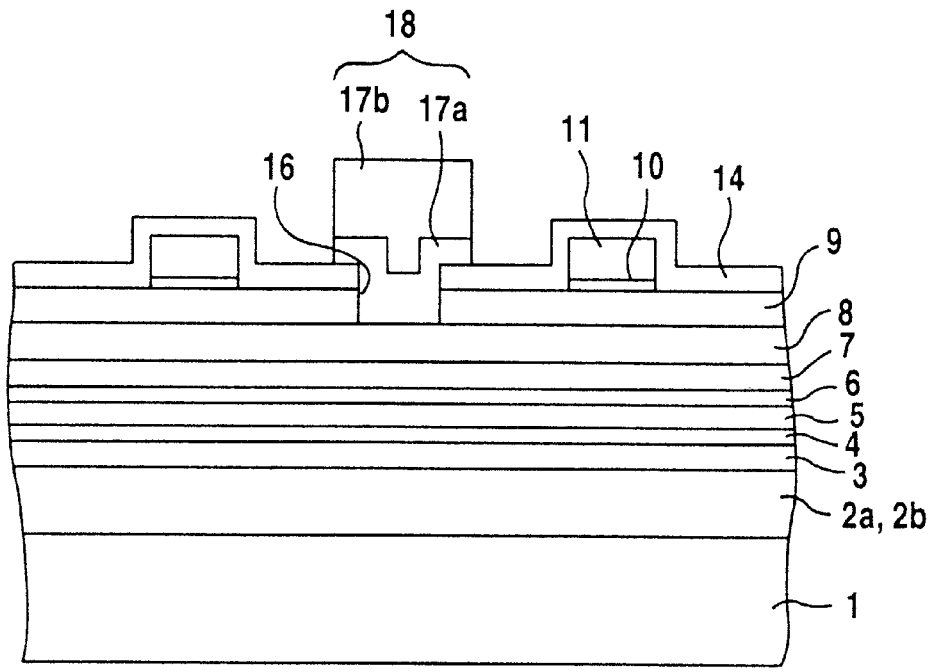

As shown in FIG. 2G, a tungsten silicide (WSi) layer 17a and a gold (Au) layer 17b are then formed on the insulating film 14 and in the second recess 16 by sputtering to have a thickness of 150 nm and 500 nm respectively.

The Au layer 17b and the WSi layer 17a are then left in the second recess 16 and its peripheral area by patterning them. Thus, as shown in FIG. 2G, a T-shaped gate electrode 18 is formed of the Au layer 17b and the WSi layer 17a. A Schottky barrier exists on the boundary between the gate electrode 18 and the Schottky layer 8.

The insulating film 14 is then patterned by the photolithography technique using the resist, and thus source/drain openings 14s, 14d are formed on the outside of two island-like cap layers 11. A triple-layered metal layer 19 made of gold-germanium (AuGe)/nickel (Ni)/gold (Au) is then formed by evaporation.

The triple-layered metal layer 19 is formed by the lift-off method and thus left on the buried layer 9 on the outside of two island-like cap layers 11. As a result, two triple-layered metal layers 19 which are formed on the outside of two island-like cap layers 11 can be employed as a drain electrode 19d and a source electrode 19s.

After this, the lowermost layer made of AuGe is diffused up to the second electron supply layer 7 by heating the triple-layered metal layers 19 at the temperature of 400 to 450° C.

With the above, a basic structure of the HEMT is completed.

In the above HEMT, since the composition ratio of aluminum in AlGaAs constituting the Schottky layer 8 is set to more than 0.4, the bandgap is increased in itself. Therefore, the Schottky barrier against the gate electrode 18 becomes higher than the device shown in FIG. 1 in the prior art. As a result, a gate formed breakdown voltage is enhanced by 0.1 to 0.2 V, and generation of a walk-out phenomenon is suppressed.

If the bandgap of the Schottky layer 8 is increased, ohmic contact resistance between the source electrode 19s, the drain electrode 19d being formed thereon and the Schottky layer 8 becomes higher, and in turn an ON resistance of the transistor is increased to thus cause deterioration of the characteristic.

However, in the first embodiment, a distance (depth) from the source electrode 19s, the drain electrode 19d to an upper surface of the second electron supply layer 7 is made small by removing the cap layer 11 and the etching stopper layer 10, so that the constituent metal (AuGe) of the source electrode 19s, the drain electrode 19d can be thermal-diffused easily into the second electron supply layer 7. Therefore, the ohmic resistance is reduced and thus the ON resistance is also decreased.

It has been found that, when a relationship between the distance from the source electrode 19s, the drain electrode 19d to an upper surface of the second electron supply layer 7 and the ohmic resistance is examined, it is significant for reduction in the ohmic resistance and in turn reduction in the ON resistance to set a resultant thickness from an upper surface of the electron supply layer to the source/drain electrodes to less than 100 nm. For instance, the ON resistance has been less than 1 Ωmm when the thickness is 55 nm, nevertheless the ON-resistance has been 2 to 8 Ωmm when the thickness is 140 nm.

In the first embodiment, with regard to the above respects, a thickness from the upper surface of the second electron supply layer 7 to the upper surface of the buried layer 9 is set to about 100 nm at its maximum.

There is the limit in thinking the thickness. More particularly, the thickness must be set such that a surface depletion layer, which extends from the buried layer 9 downward, does not reach the second electron supply layer 7 in the neighborhood of the gate electrode 18. If the surface depletion layer reaches the second electron supply layer 7, the 2-DEG (two-dimensional electron gas) concentration of the channel layer 5 is reduced to cause deterioration of the transistor parameters. It is preferable that, with regard to this respect, a lower limit of the thickness from the upper surface of the second electron supply layer 7 to the upper surface of the buried layer 9 should be set to 15 nm in the first embodiment.

Figure 2H:
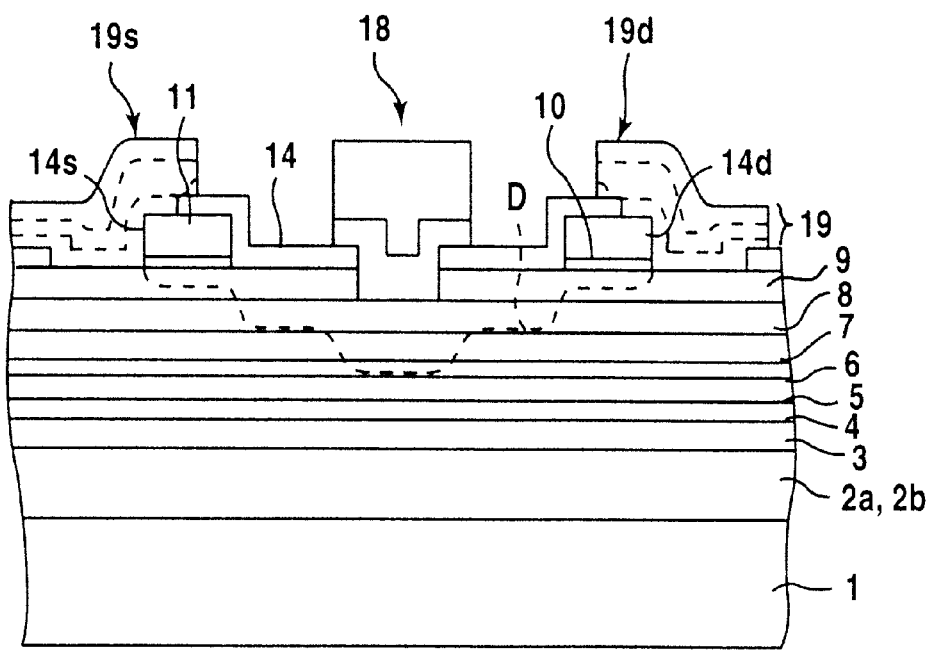

A reference D in FIG. 2H denotes an example of the distribution of the surface depletion layer and the depletion layer generated by the gate.

In the above explanation, the source/drain electrodes are connected to the buried layer. In contrast, the distance between the source/drain electrodes and the channel layer may be shortened by etching the layers located below the buried layer within the region of the second spacer layer.

(Second Embodiment)

FIGS. 3A to 3G are sectional views showing steps of manufacturing a HEMT according to a second embodiment of the present invention.

Figure 3A:
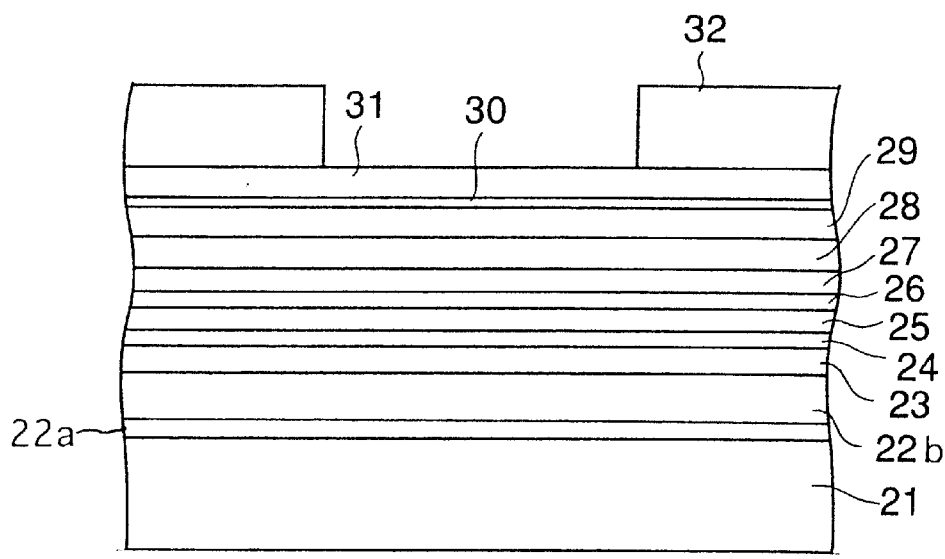
FIGS. 3A to 3G are sectional views showing steps of manufacturing a HEMT according to a second embodiment of the present invention.

First, as shown in FIG. 3A, formation of a plurality of compound semiconductor layers constituting the HEMT on the semi-insulating gallium-arsenide (GaAs) substrate 1 will be explained hereinbelow.

In FIG. 3A, a first buffer layer 22a made of undoped GaAs, a second buffer layer 22b made of undoped AlGaAs, a first electron supply layer 23 made of n$^+$-AlGaAs, a first spacer layer 24 made of undoped AlGaAs, a channel layer 25 made of undoped indium-gallium-arsenide (InGaAs), a second spacer layer 26 made of undoped AlGaAs, a second electron supply layer (carrier supply layer) 27 made of n$^+$-AlGaAs, a Schottky layer 28 made of undoped n$^-$-AlGaAs, a buried layer 29 made of n$^-$-GaAs, an etching stopper layer 30 made of n$^+$-AlGaAs, and a cap layer 31 made of n$^+$-GaAs are grown in sequence on a GaAs substrate 21.

These layers are grown by the MOVPE method, the MBE method, and the like. In this case, it is preferable that a composition ratio of aluminum (Al) in group III elements which are contained in AlGaAs constituting the Schottky layer 28 should be set to 0.1 to 0.3 (e.g., 0.25). Thus, the Schottky layer 28 is composed of $Al_xGa_{1-x}As$ (0.1<x<0.3). Similarly, it is preferable that a composition ratio of aluminum (Al) in the group III elements which are contained in the etching stopper layer 30 should be selected within the same range as the Schottky layer 28.

In addition, a composition ratio of aluminum (Al) in the group III elements which are contained in AlGaAs constituting the first electron supply layer 23, the first spacer layer 24, the second spacer layer 26, and the second electron supply layer 27 is set to 0.1 to 0.3 (e.g., 0.25). Also, a composition ratio of indium (In) in the group III elements which are contained in InGaAs constituting the channel layer 5 is set to 0.1 to 0.3 (e.g., 0.25).

Next, preferable ranges of the film thickness of the compound semiconductor layers will be explained hereinbelow.

Thicknesses of the GaAs first buffer layer 22a to the AlGaAs second electron supply layer 27 are set to be equal to those of the GaAs first buffer layer 2a to the AlGaAs second electron supply layer 7, which have the same functions as those of the above layers, in the first embodiment respectively. A thickness of the AlGaAs Schottky layer 28 is 5 to 30 nm (e.g., 20 nm), a thickness of the GaAs buried layer 29 is 15 to 50 nm (e.g., 30 nm), a thickness of the AlGaAs etching stopper layer 30 is 1 to 10 nm (e.g., 3 nm), and a thickness of the GaAs cap layer 31 is 30 to 150 nm (e.g., 80 nm).

As with the impurity concentration of the impurity doped layers, the silicon concentration of the AlGaAs first electron supply layer 23 to the AlGaAs second electron supply layer 27 are set identically to that of the AlGaAs first electron supply layer 3 to the AlGaAs second electron supply layer 7 in the first embodiment respectively. Also, the silicon concentration of the Schottky layer 28 is $1 \times 10^{16}$ to $1 \times 10^{17}$ atoms/cm$^3$ (e.g., $5 \times 10^{16}$ atoms/cm$^3$), and the silicon concentration of the GaAs buried layer 29 is $1 \times 10^{16}$ to $1 \times 10^{17}$ atoms/cm$^3$ (e.g., $5 \times 10^{16}$ atoms/cm$^3$). Also, the silicon concentration of the AlGaAs etching stopper layer 30 and the GaAs cap layer 31 is set to be equal to that in the first embodiment.

After the growth of the above semiconductor layers has been completed, resist 32 is coated on the cap layer 31. Then, the resist 32 is patterned by exposing and developing the resist 32 to have a shape covering the source/drain regions.

Figure 3B:
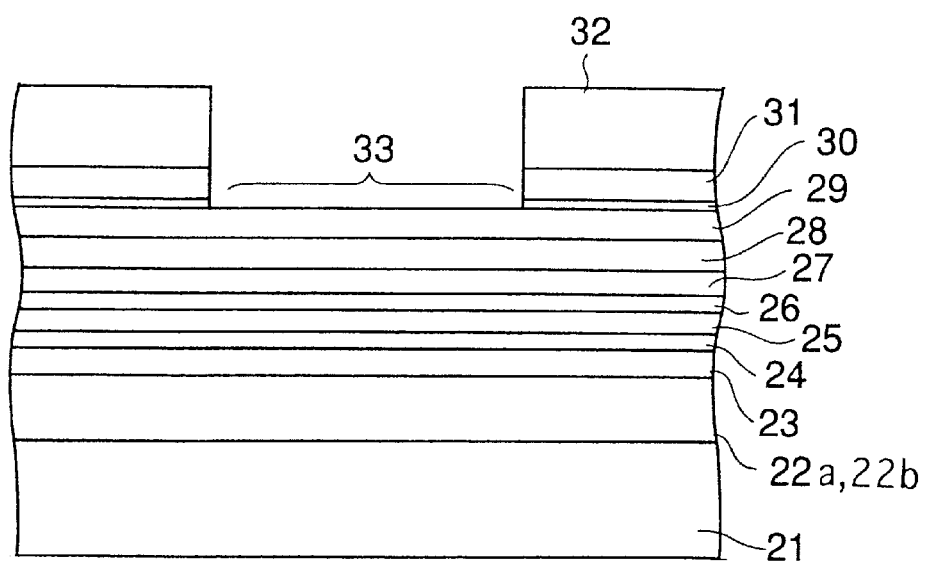

The GaAs cap layer 31 is then etched by using the resist 32 as a mask to form a first recess 33, as shown in FIG. 3B.

In this etching step, if the GaAs cap layer 31 is etched by the plasma etching method using the mixed gas of $SiCl_4$ and $SF_6$ as the reaction gas, an etching rate becomes slow rapidly at a point of time when the AlGaAs etching stopper layer 30 formed beneath the GaAs cap layer 31 is exposed. Thus, stop of the etching of the GaAs cap layer 31 can be easily controlled.

While using the resist 32 as a mask, the AlGaAs etching stopper layer 30 exposed from the first recess 33 is removed by using ammonia, nitric acid, or hydrogen fluoride, for example.

Figure 3C:
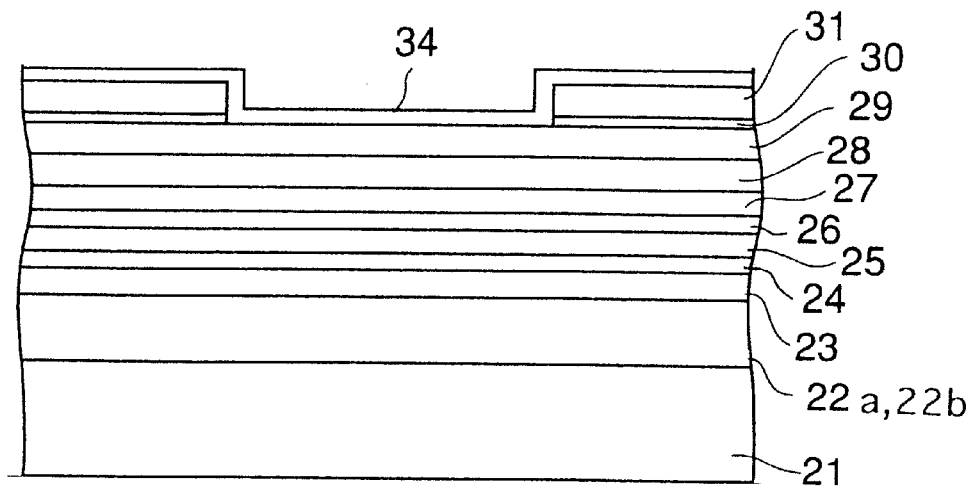

The resist 32 is then removed and, as shown in FIG. 3C, an insulating film 34 is grown on an exposed surface of the GaAs cap layer 31 and an exposed surface of the GaAs buried layer 29 and an exposed side surface of the AlGaAs etching stopper layer 30 by the plasma CVD method.

Figure 3D:
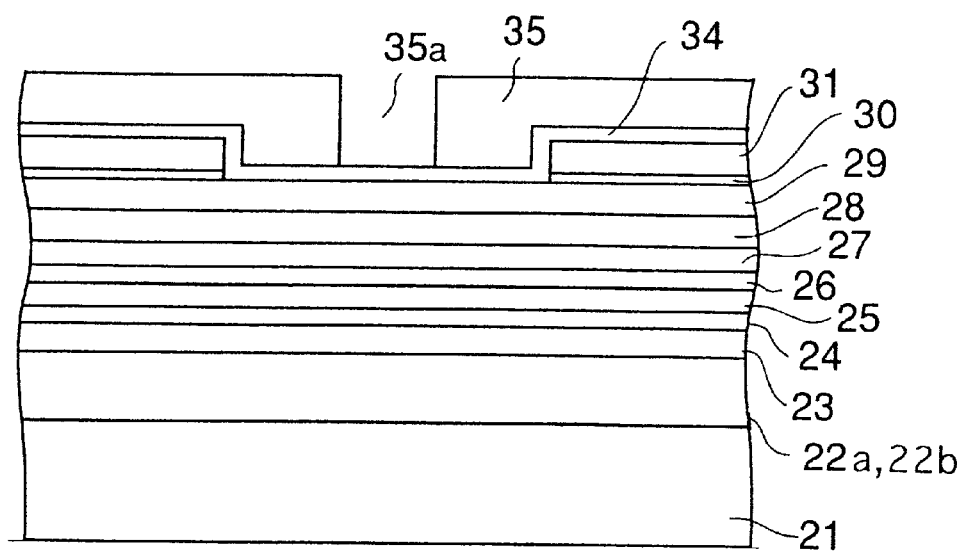

Another resist 35 is then coated on the insulating film 34 and then, as shown in FIG. 3D, a window 35a is formed in the gate region by exposing and developing the resist 35. Then, an opening portion 34a is formed by etching the insulating film 34 being exposed from the window 35a by virtue of the reactive ion etching.

Figure 3E:
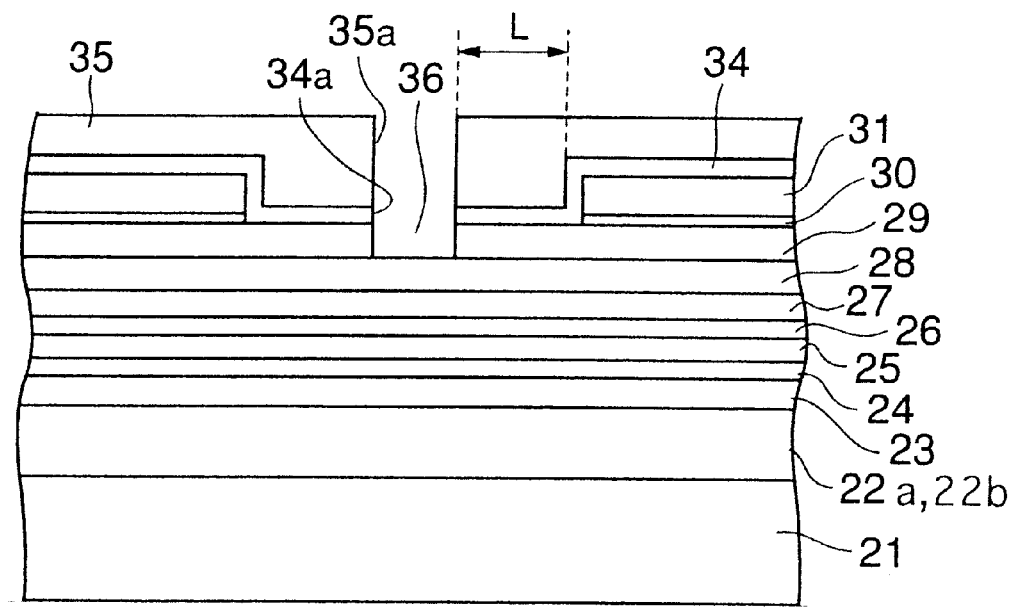

As shown in FIG. 3E, the GaAs buried layer 29 is etched via the opening portion 34a under the same conditions as the first recess 33, whereby a second recess 36 is formed in the GaAs buried layer 29.

The resist 35 is then removed.

Figure 3F:
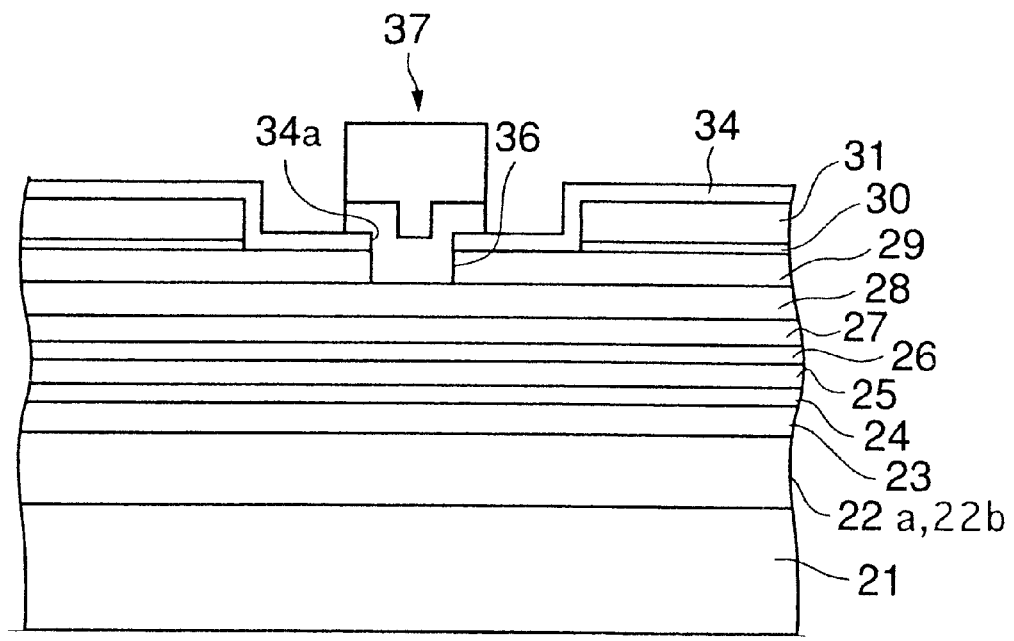

As shown in FIG. 3F, a metal film is formed in the opening portion 34a of the insulating film 34 and the second recess 36 by sputtering. The metal film is formed to have a double-layered structure of a tungsten silicide (WSi) layer and a gold (Au) layer have a thickness of 150 nm and 500 nm respectively.

Further, as shown in FIG. 3F, a T-sectional shaped gate electrode 37 which is connected to the Schottky layer 28 by virtue of the Schottky contact via the opening portion 34a and the second recess 36 is formed by patterning the metal layer by means of photolithography. A length of the gate electrode 37 along the direction from the source region to the drain region, i.e., a gate length, is set to less than 0.6 μm.

The insulating film 34 is then patterned by photolithography technique using the resist (not shown), and thus two opening portions 34s, 34d are formed on the GaAs cap layer 31 on both sides of the gate electrode 37. A multi-layered conductive layer is then formed by growing three layers of gold-germanium (AuGc)/nickel (Ni)/gold (Au) in sequence by evaporation.

Figure 3G:
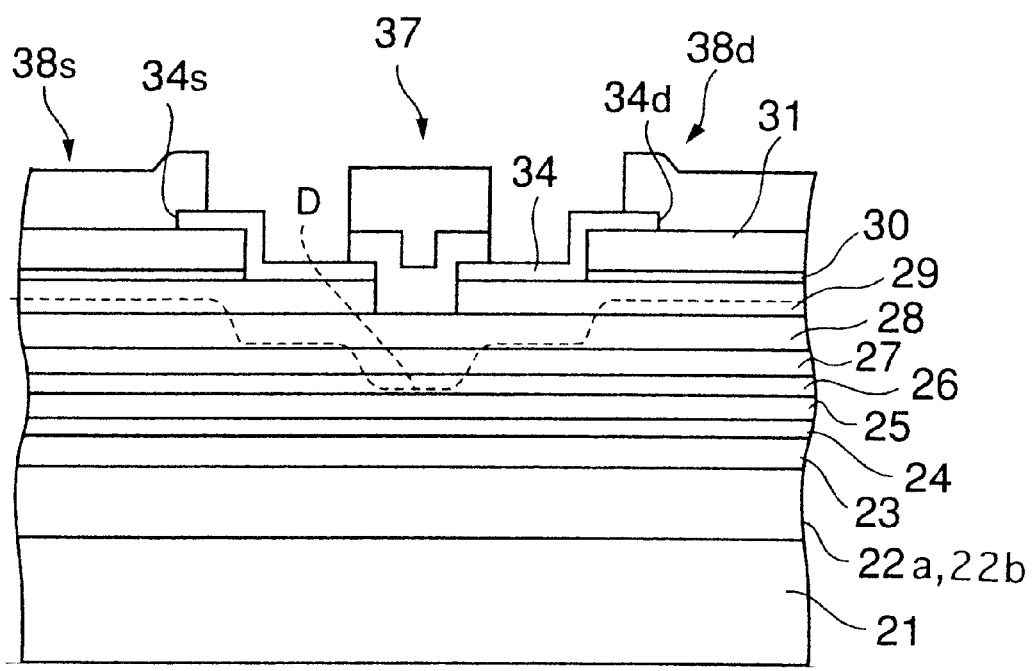

The multi-layered conductive layer is formed by the lift-off method. Thus, the multi-layered conductive layer being left in two opening portions 34s, 34d is employed as a drain electrode 38d and a source electrode 38s, as shown in FIG. 3G.

Thereby, a basic structure of the HEMT can be completed.

In the above HEMT, because the impurity concentration of the Schottky layer 28 and the buried layer 29 is set to more than $1 \times 10^{16}$ atoms/cm$^3$, generation of the walk-out phenomenon can be suppressed. The reason why the walk-out phenomenon can be suppressed may be supposed as follows.

For the walk-out phenomenon, such a model has been proposed that holes are released from the bonded elements because electrons collide with the bonded elements in the channel layer 25 and then the surface depletion layer is reduced because the holes are trapped (caught) by the surface state. For example, such model is set forth in IEEE, Transaction on Electronic Device, Vol.45., No. 1, 1998, p. 18.

Therefore, in the second embodiment, the Schottky layer 28 and the buried layer 29 can act as the barrier against the holes by enhancing the impurity concentration of the Schottky layer 28 and the buried layer 29, so that they can prevent the holes which are separated from the channel layer 25 from reaching the surface depletion layer of the buried layer 29. Even if the holes are trapped by the surface state, an amount of trapped holes is very small and thus a degree of reduction in the surface depletion layer can be made small rather than the HEMT structure in the prior art shown in FIG. 1.

The surface depletion layer whose reduction can be prevented in this manner can prevent the travel of the carriers supplied from the drain electrode 38d toward the gate electrode 37. Therefore, the walk-out phenomenon can be suppressed and also reduction in the gate breakdown voltage can be prevented.

On the contrary, if the impurity concentration of the Schottky layer 28 and the buried layer 29 is more than $1 \times 10^{17}$ atoms/cm$^3$, the resistance values of these layers are reduced. As a result, the electrons are ready to transmit through the Schottky layer 28 and the buried layer 29, and thus the gate breakdown voltage can be reduced. Accordingly, it is preferable that the impurity concentration is reduced smaller than $1 \times 10^{17}$ atoms/cm$^3$.

If the recess distance L is reduced smaller than 0.15 µm, the number of electrons which can travel from the drain electrode 38d to the gate electrode 37 is increased to thus reduce the gate breakdown voltage. In contrast, if the recess distance L becomes longer than 0.6 µm, a surface area of the recess acting as the cause of the walk-out phenomenon is increased and therefore the holes are ready to be trapped by the surface state.

Figure 4:
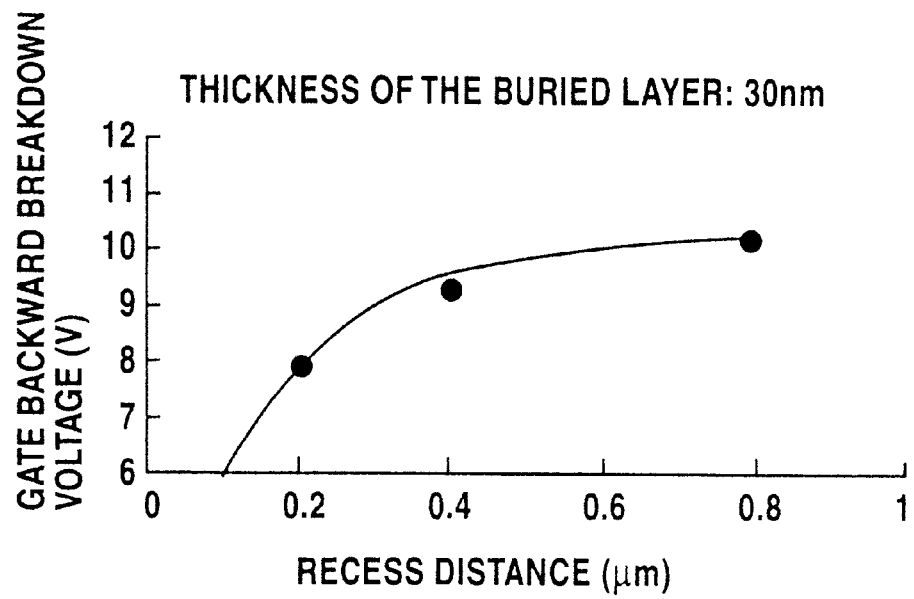
FIG. 4 is a view showing a relationship between a recess distance L and a gate backward breakdown voltage in the HEMT according to the second embodiment of the present invention.
Figure 5:
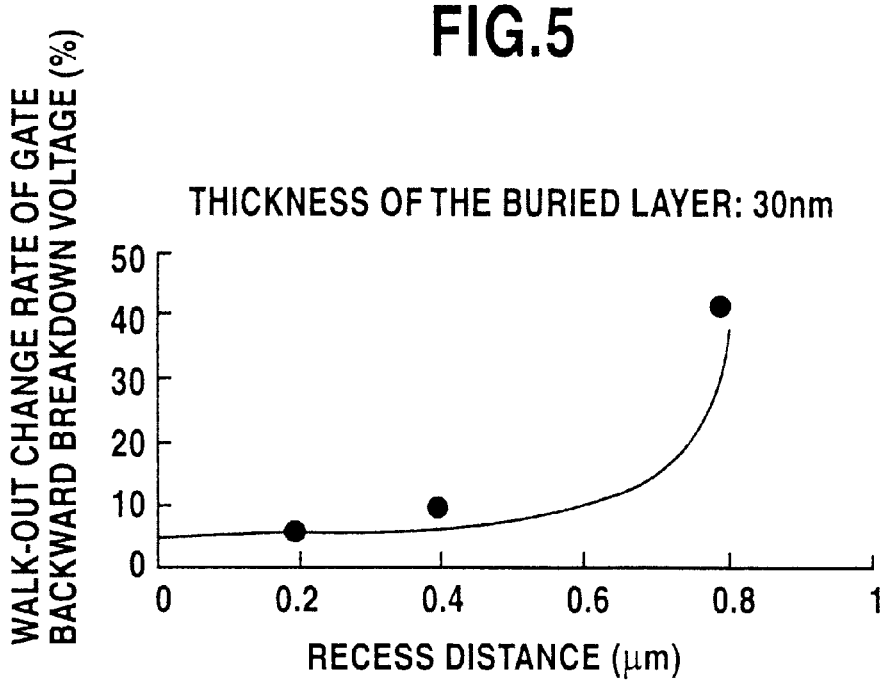
FIG. 5 is a view showing a relationship between the recess distance L and a walk-out change rate of the gate backward breakdown voltage in the HEMT according to the second embodiment of the present invention.

A relationship between the recess distance L and a gate backward breakdown voltage in the HEMT according to the second embodiment is shown in FIG. 4. A relationship between the recess distance L and a walk-out change rate of the gate backward breakdown voltage in the HEMT according to the second embodiment is shown in FIG. 5.

Therefore, it is preferable that the recess distance L should be set in the range of 0.15 to 0.6 µm.

In addition, based on the examination conducted by the inventors of the present invention, it has become evident that, if a thickness of the buried layer 29 is set thinner than 15 nm, the surface depletion layer reaches the second electron supply layer 27 to thus reduce the maximum value Ifmax of the channel current whereas, if the thickness of the buried layer 29 is set thicker than 50 nm, a contact area to the gate electrode 37 is increased to thus reduce the gate forward breakdown voltage.

Figure 6:
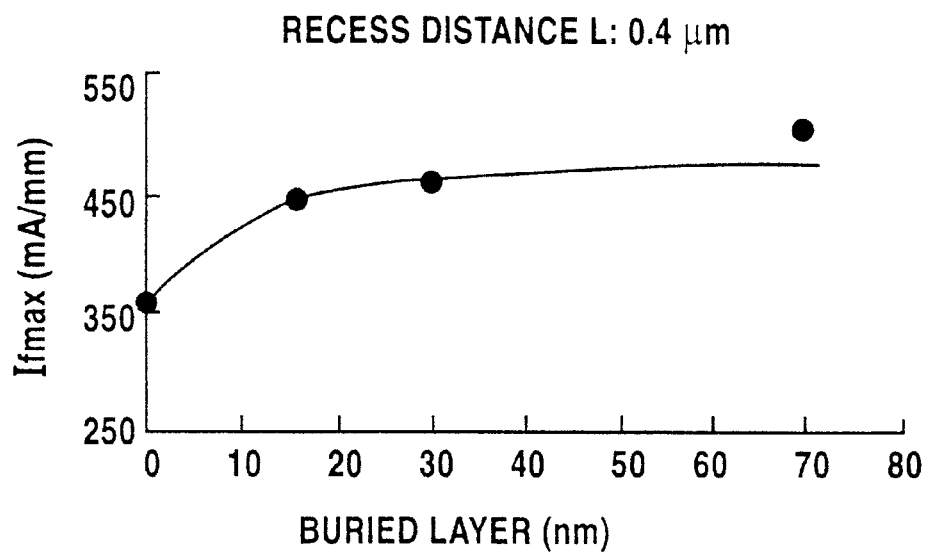
FIG. 6 is a view showing a relationship between a film thickness of a buried layer and a maximum channel current in the HEMT according to the second embodiment of the present invention.
Figure 7:
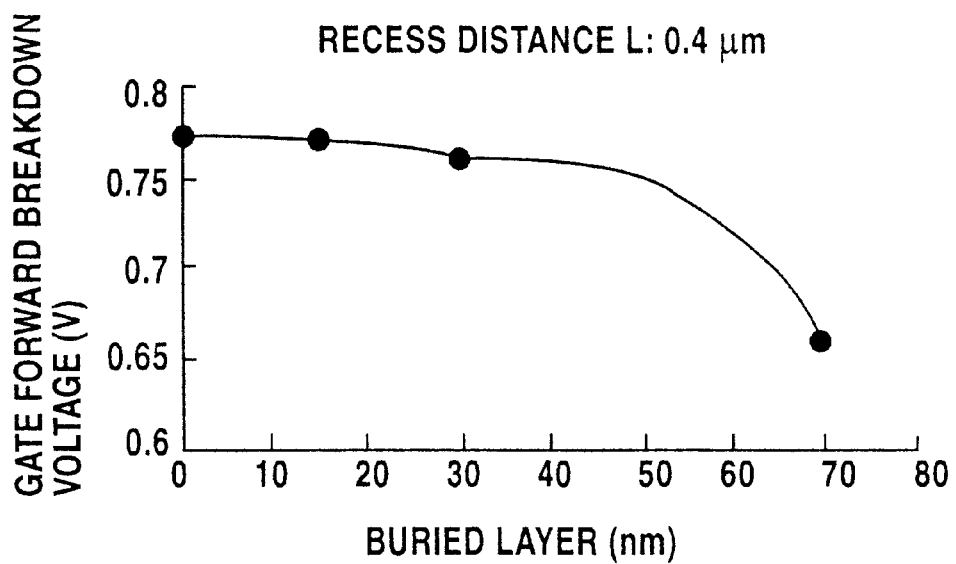
FIG. 7 is a view showing a relationship between the film thickness of the buried layer and a gate forward breakdown voltage in the HEMT according to the second embodiment of the present invention.

A relationship between a film thickness of the buried layer 29 and the maximum channel current Ifmax in the HEMT according to the second embodiment is shown in FIG. 6. A relationship between the film thickness of the buried layer 29 and a gate forward breakdown voltage in the HEMT according to the second embodiment is shown in FIG. 7.

Accordingly, it is preferable that the thickness of the buried layer should be set thicker than 15 nm but thinner than 50 nm.

(Third Embodiment)

A third embodiment of the present invention has a structure in which the composition and the impurity concentration of the Schottky layer and respective layers formed on the Schottky layer in the HEMT shown in the second embodiment are changed.

Figure 8:
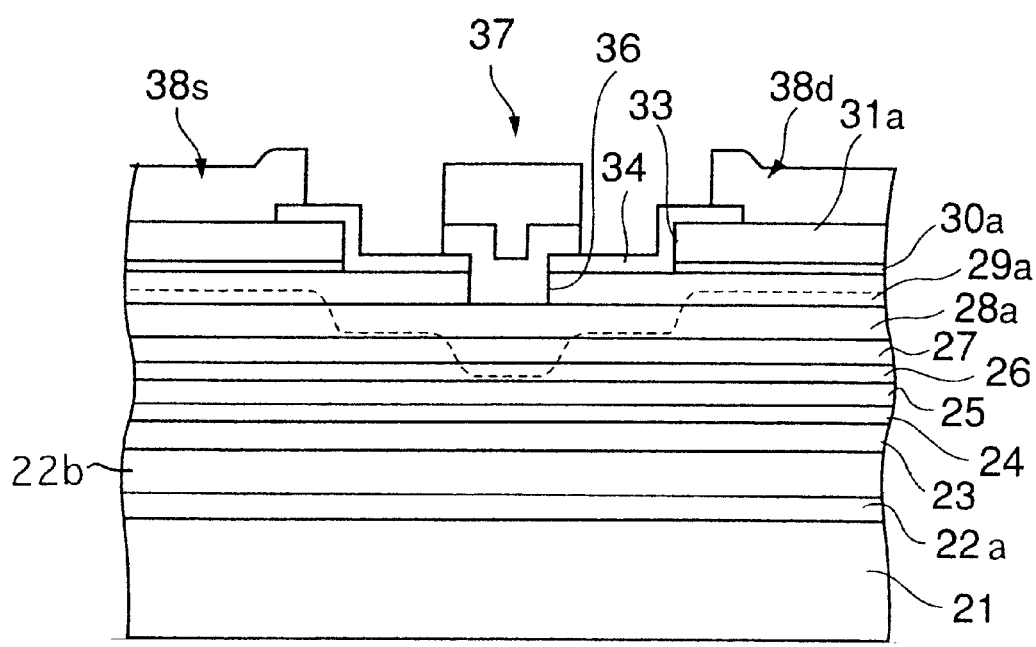
FIG. 8 is a sectional view showing a configuration of a HEMT according to a third embodiment of the present invention.

FIG. 8 is a sectional view showing a configuration of a HEMT according to the third embodiment of the present invention. In FIG. 8, the same references as those in FIG. 3G refer to the same elements in FIG. 3G.

In FIG. 8, the first buffer layer 22a made of undoped GaAs, the second buffer layer 22b made of undoped AlGaAs, the first electron supply layer 23 made of n$^+$-AlGaAs, the first spacer layer 24 made of undoped AlGaAs, the channel layer 25 made of undoped indium-gallium-arsenide (InGaAs), the second spacer layer 26 made of undoped AlGaAs, the second electron supply layer (carrier supply layer) 27 made of n$^+$-AlGaAs, a Schottky layer 28a made of undoped AlGaAs, an n$^-$-GaAs buried layer 29a, an n$^+$-AlGaAs etching stopper layer 30a, and an n$^+$-GaAs cap layer 31a are grown in sequence on the GaAs substrate 21.

These layers are grown by the MOVPE method, the MBE method, and the like.

In this case, it is preferable that a composition ratio of aluminum (Al) in group III elements which are contained in AlGaAs constituting the Schottky layer 28a should be set to more than 0.4 (e.g., 0.5). Thus, the Schottky layer 28a is composed of $Al_xGa_{1-x}As$ (x>0.4). Similarly, it is preferable that a composition ratio of aluminum (Al) in the group III elements which are contained in the etching stopper layer 30a should be set to more than 0.1 (e.g., 0.25). Thus, the etching stopper layer 30a is composed of $Al_yGa_{1-y}As$ (y>0.1). Other layers made of AlGaAs are set to the same composition ratio of aluminum in the second embodiment.

Accordingly, the bandgap of AlGaAs constituting the Schottky layer 28a becomes wider than that of AlGaAs constituting other layers.

Next, preferable ranges of the film thickness of the compound semiconductor layers will be explained hereinbelow.

Thicknesses of the GaAs first buffer layer 22a to the AlGaAs second electron supply layer 27 are set to be equal to those in the second embodiment respectively. A thickness of the AlGaAs Schottky layer 28a is 5 to 30 nm (e.g., 20 nm), a thickness of the GaAs buried layer 29a is 10 to 70 nm (e.g., 30 nm), a thickness of the AlGaAs etching stopper layer 30a is 1 to 10 nm (e.g., 3 nm), and a thickness of the GaAs cap layer 31a is less than 50 nm (e.g., 20 nm).

Concerning the impurity concentration of the silicon doped layers, the silicon concentration of the GaAs first buffer layer 22a to the AlGaAs second electron supply layer 27 are set identically to that in the second embodiment respectively. Although the Schottky layer 28a is formed of the undoped layer, the impurity may be contained at the impurity concentration of less than $5 \times 10^{17}$ atoms/cm$^3$. In addition, the silicon concentration of the GaAs buried layer 29a is set to less than $5 \times 10^{17}$ atoms/cm$^3$ (e.g., $5 \times 10^{16}$ atoms/cm$^3$). Also, the silicon concentration of the AlGaAs etching stopper layer 30a and the GaAs cap layer 31 a is set to be equal to that in the second embodiment.

After this, according to the steps explained in the second embodiment, a first recess 33 is formed, then the buried layer 29a is covered with an insulating film 34, then a second recess 36 is formed, then a gate electrode 37 is formed, and then a source electrode 38s and a drain electrode 38d are formed.

Then, a lowermost layer of AuGe of the triple-layered AuGe/Ni/Au structure constituting the source electrode 38s and the drain electrode 38d is heated at the temperature of 400 to 400° C. so as to reach the second electron supply layer 27.

According to such HEMT, since the composition ratio of Al in AlGaAs constituting the Schottky layer 28a is set higher than that in the device in the prior art, the bandgap of the Schottky layer 28a is increased, so that the Schottky barrier between the gate electrode 37 and the Schottky layer 28a can be increased higher than that of the device in the prior art. In the case of enhancement operation of the device, the gate forward operational voltage can be improved by 0.1 to 0.2 V.

However, as described in the first embodiment, if the bandgap of the Schottky layer 28a is increased, the ohmic resistance of the source electrode 38s and the drain electrode 38d is increased to thus increase the ON resistance.

In order to overcome such problem, it is effective to diffuse the lowermost layer of AuGe of the triple-layered metal layer constituting the source electrode 38s and the drain electrode 38d by heating until it can reach the electron supply layer.

In this case, it is preferable that a distance from lower surfaces of the source electrode 38s and the drain electrode 38d to an upper surface of the second electron supply layer 27 is set to less than 100 nm. In the third embodiment, the distance is set to 75 nm.

The distance must be held to such extent that the surface depletion layer caused by the buried layer 29 in the first recess 33 does not reach the second electron supply layer 27. This is because, if the surface depletion layer reaches the second electron supply layer 27, the 2-DEG concentration of the channel layer 25 is reduced so that the transistor parameters are degraded.

(Fourth Embodiment)

In the above first to third embodiments, the first electron supply layer 25, the second electron supply layer 27, the first spacer layer 24, the second spacer layer 26, and the Schottky layer 28 are formed of AlGaAs respectively.

Figure 9:
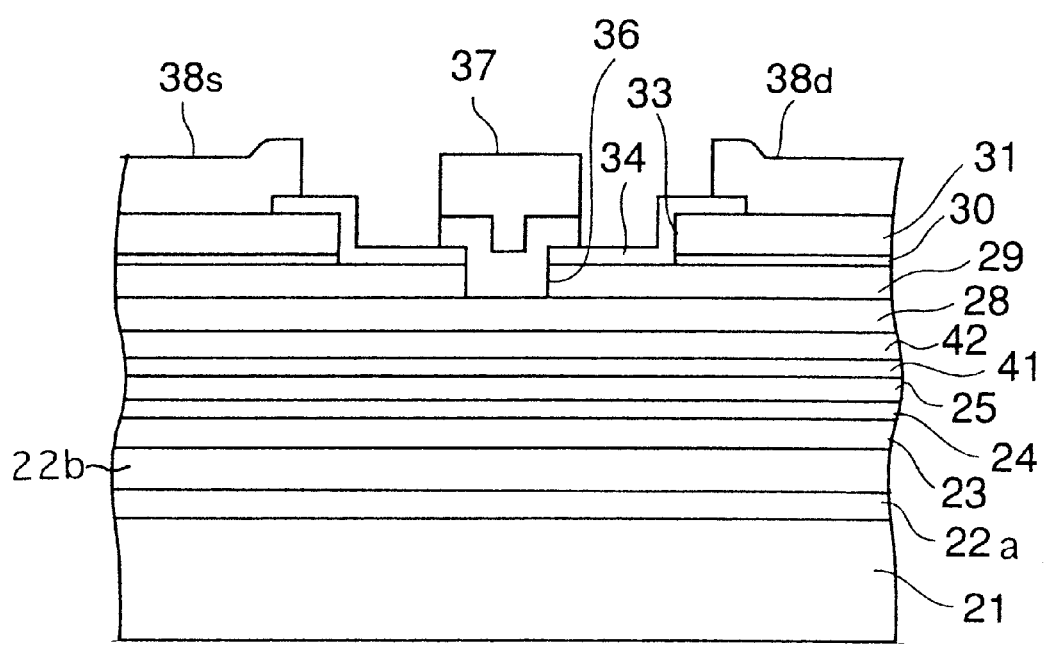
FIG. 9 is a sectional view showing a configuration of a HEMT according to a fourth embodiment of the present invention.

However, as shown in FIG. 9, if a second spacer layer 41 and a second electron supply layer 42 are formed of InGaP, it is ready to increase the impurity concentration. Accordingly, under the condition that an amount of electrons supplied from the second electron supply layer 42 to the channel layer 25 is fixed constant, if InGaP is employed, it is possible to reduce thicknesses of the second spacer layer 41 and the second electron supply layer 42 up to ½ to ⅓ rather than the case where AlGaAs is employed. As a result, transconductance (gm) can be enhanced if the second spacer layer 41 and the second electron supply layer 42 are formed of InGaP.

In this case, in FIG. 9, configurations of the HEMT according to the fourth embodiment other than the second spacer layer 41 and the second electron supply layer 42 is identical to those of the second embodiment. In FIG. 9, the same references as those in FIG. 3G denote the same elements.

In FIG. 9, the first buffer layer 22a made of undoped GaAs, the second buffer layer 22b made of undoped AlGaAs, a first electron supply layer 23 made of n$^+$-AlGaAs, the first spacer layer 24 made of undoped AlGaAs, the channel layer 25 made of undoped indium-gallium-arsenide (InGaAs), a second spacer layer 41 made of undoped InGaP, a second electron supply layer (carrier supply layer) 42 made of n$^+$-InGaP, the Schottky layer 28 made of n$^-$-AlGaAs, the buried layer 29 made of n$^-$-GaAs, the etching stopper layer 30 made of n$^+$-AlGaAs, and the cap layer 31 made of n$^+$-GaAs are formed in sequence on the GaAs substrate 21.

A composition ratio of indium (In) in group III elements which are contained in InGaP constituting the second spacer layer 41 and the second electron supply layer 42 is set to 0.48. A thickness of the second spacer layer 41 is set to less than 5 nm (e.g., 2 nm), and a thickness of the second electron supply layer 42 is set to 5 to 20 nm (e.g., 8 nm). In addition, the silicon impurity concentration of the second electron supply layer 42 is set in the range of $1 \times 10^{18}$ to $3 \times 10^{18}$ atoms/cm$^3$ (e.g., $2 \times 10^{18}$ atoms/cm$^3$).

Other configurations of the HEMT are similar to those of the second embodiment.

(Fifth Embodiment)

In the above fourth embodiment, only the second spacer layer 41 and the second electron supply layer 42 are formed of InGaP. But, as shown in FIG. 10, a Schottky layer 43 may also be formed of InGaP.

Figure 10:
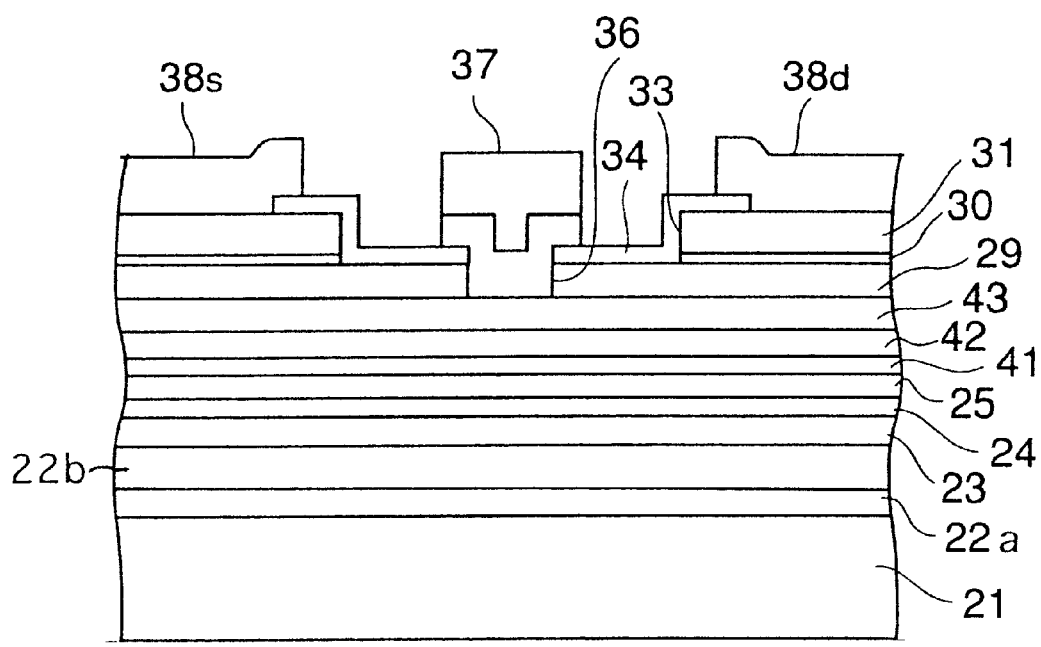
FIG. 10 is a sectional view showing a configuration of a HEMT according to a fifth embodiment of the present invention.

In FIG. 10, the same references as those in FIG. 9 refer to the same elements.

As shown in FIG. 10, if the Schottky layer 43 is formed of InGaP, the gate breakdown voltage can be enhanced rather than the case where the Schottky layer 43 is formed of AlGaAs.

A configuration of a HEMT according to a fifth embodiment shown in FIG. 10 is similar to that of the fourth embodiment except for the Schottky layer 43.

A composition ratio of indium (In) in group III elements which are contained in InGaP constituting the Schottky layer 43 is set to 0.48. In addition, the impurity concentration contained in InGaP is set in the range of $1 \times 10^{18}$ to $3 \times 10^{18}$ atoms/cm$^3$ (e.g., $2 \times 10^{18}$ atoms/cm$^3$). A thickness of the Schottky layer 43 is set to 5 to 30 nm (e.g., 20 nm).

Other configurations of the HEMT arc similar to those of the fourth embodiment.

(Sixth Embodiment)

In the above fourth embodiment, only the second spacer layer 41 and the second electron supply layer 42 are formed of InGaP.

Figure 11:
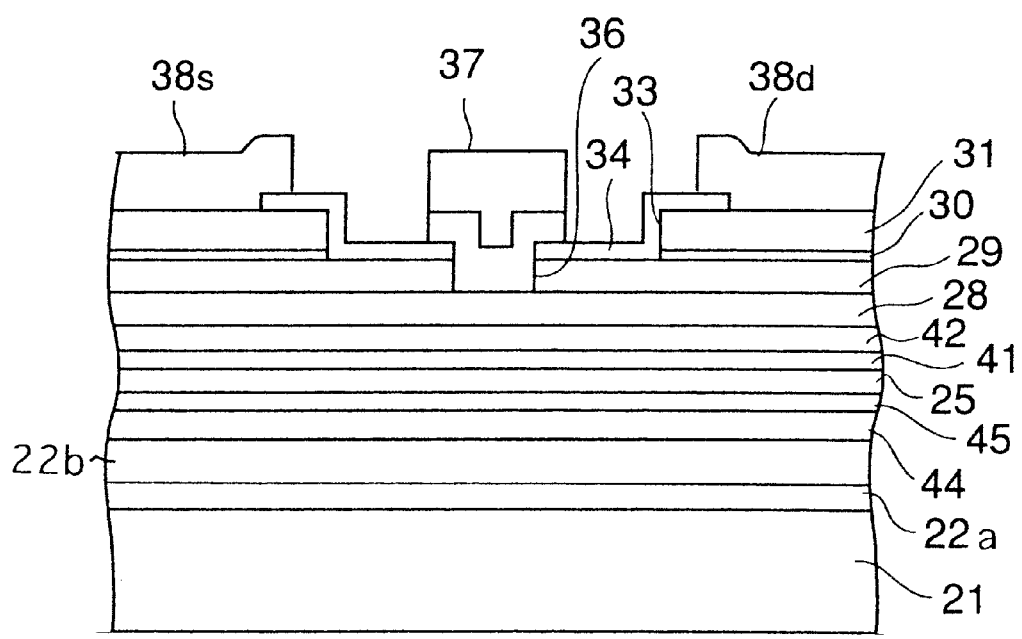
FIG. 11 is a sectional view showing a configuration of a HEMT according to a sixth embodiment of the present invention.

However, as shown in FIG. 11, a first electron supply layer 44 and a first spacer layer 45 may also be formed of InGaP respectively. If such material is selected, thicknesses of the first electron supply layer 44 and the first spacer layer 45 can be thinned and the transconductance (gm) can be enhanced rather than the fourth embodiment. However, it is preferable that, if easiness of epitaxial growth is taken into account, material shown in the fourth embodiment should be selected as constituent material of the first electron supply layer and the first spacer layer.

A layer configuration of a HEMT according to a sixth embodiment shown in FIG. 11 is similar to that of the fourth embodiment other than the first electron supply layer 44 and the first spacer layer 45. The impurity concentration, composition, and film thickness of the first electron supply layer 44 and the first spacer layer 45, which have different composition from that in the fourth embodiment, are given as follows.

A composition ratio of indium (In) in group III elements which are contained in InGaP constituting the first spacer layer 44 is set to 0.48. A thickness of the first spacer layer 44 is set to more than 0 nm but less than 5 nm (e.g., 2 nm).

A composition ratio of indium (In) in group III elements which are contained in InGaP constituting the first electron supply layer 45 is set to 0.48. In addition, the impurity concentration contained in InGaP is set in the range of $1 \times 10^{18}$ to $3 \times 10^{18}$ atoms/cm$^3$ (e.g., $2 \times 10^{18}$ atoms/cm$^3$). A thickness of the first electron supply layer 45 is set to 1 to 10 nm (e.g., 4 nm).

Other configurations of the HEMT are similar to those of the fourth embodiment.

(Seventh Embodiment)

Figure 12:
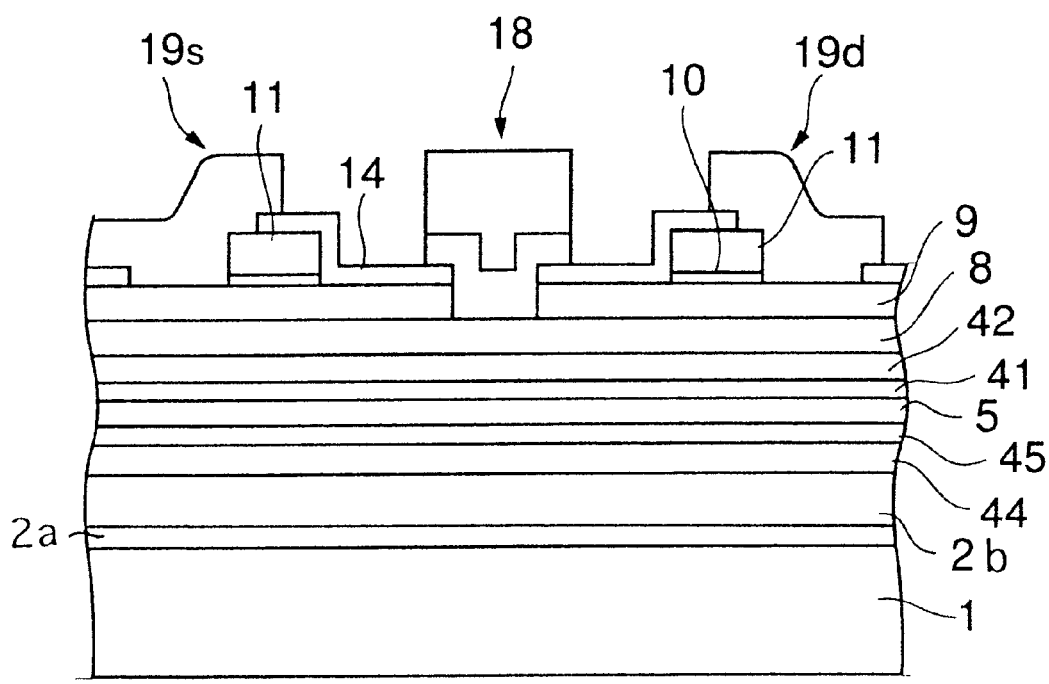
FIG. 12 is a sectional view showing a configuration of a HEMT according to a seventh embodiment of the present invention.

FIG. 12 is a sectional view showing a configuration of a HEMT according to a seventh embodiment of the present invention. In FIG. 12, the same references as those in FIG. 2A denote the same elements.

The HEMT of the seventh embodiment has a configuration in which material of the first electron supply layer, the first spacer layer, the second spacer layer, and the second electron supply layer of the HEMT in the first embodiment is changed into InGaP.

In FIG. 12, the first buffer layer 2a made of undoped GaAs, the second buffer layer 2b made of undoped AlGaAs, a first electron supply layer 44 made of n$^+$-InGaP, a first spacer layer 45 made of undoped InGaP, the channel layer 5 made of undoped InGaAs, a second spacer layer 41 made of undoped InGaP, a second electron supply layer 42 made of n$^+$-InGaP, the Schottky layer 8 made of undoped AlGaAs, the buried layer 9 made of n$^-$-GaAs, the etching stopper layer 10 made of n$^+$-AlGaAs, and the cap layer 11 made of n$^+$-GaAs are formed in order on the GaAs substrate 1.

In this case, material, impurity concentration, and film thickness of the first electron supply layer 44, the first spacer layer 45, the second spacer layer 41, and the second electron supply layer 42 are selected similarly to those in the sixth embodiment. Material, impurity concentration, and film thickness of remaining layers are set to those in the first embodiment.

Layer configurations from the Schottky layer 8 to the cap layer 11 are same as those of the first embodiment. Since the Schottky layer 8 has the wider bandgap, the gate breakdown voltage can be made higher to thus reduce the ON-resistance rather than the HEMT shown in the sixth embodiment.

In the fourth to seventh embodiments, the electron supply layers, the spacer layers, etc. are formed of InGaP. In this case, AlInGaP or AlInAs may be employed in place of InGaP.

Figure 22:
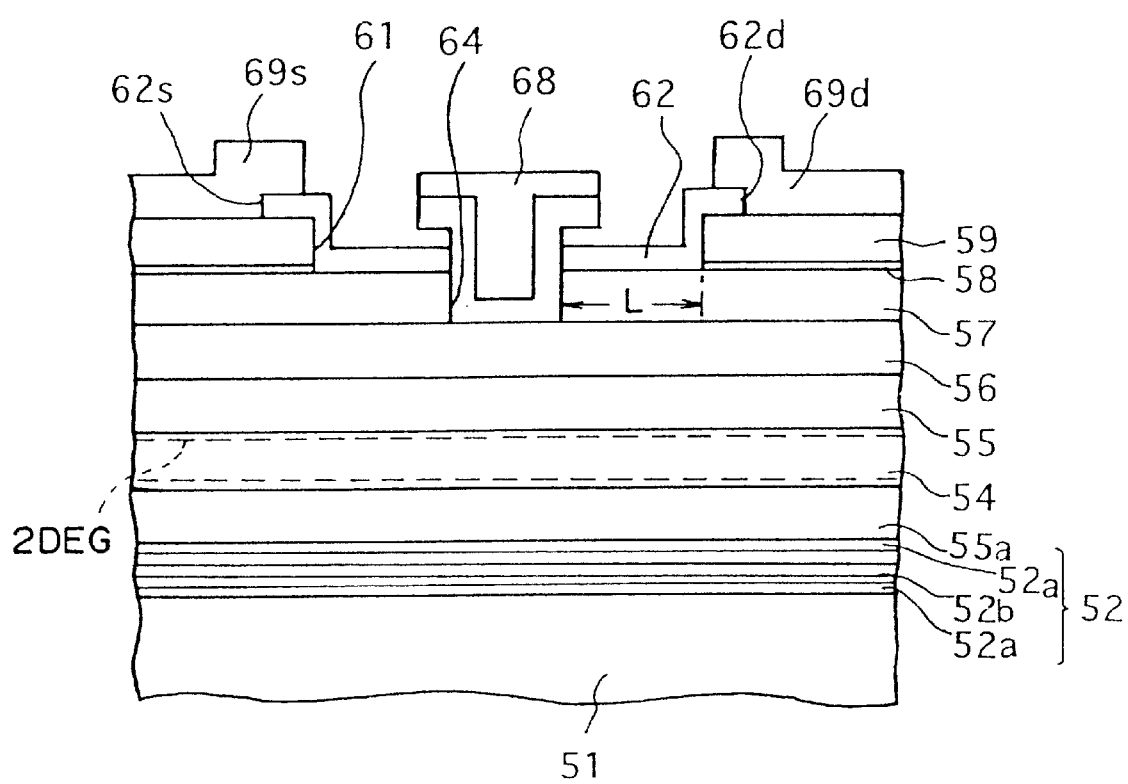
FIG. 22 is a sectional view showing another configuration of the HEMT according to the eighth embodiment of the present invention.

In the first to seventh embodiments, the first buffer layer is composed of a GaAs single layer. But, the present invention is not limited to this. For example, as shown in FIG. 22, a multi-layered structure in which an undoped GaAs layer and an undoped AlGaAs layer are stacked alternatively may be employed, as described later. In the above HEMT, the channel layer is formed on and under the electron supply layer and the first spacer layer may be omitted.

(Eighth Embodiment)

In an eighth embodiment, an insulating film for covering the GaAs buried layer of the HEMT will be explained hereinbelow.

In the recent HEMT, it is essential to shorten a gate length to operate the HEMT at the high frequency.

Figure 1:
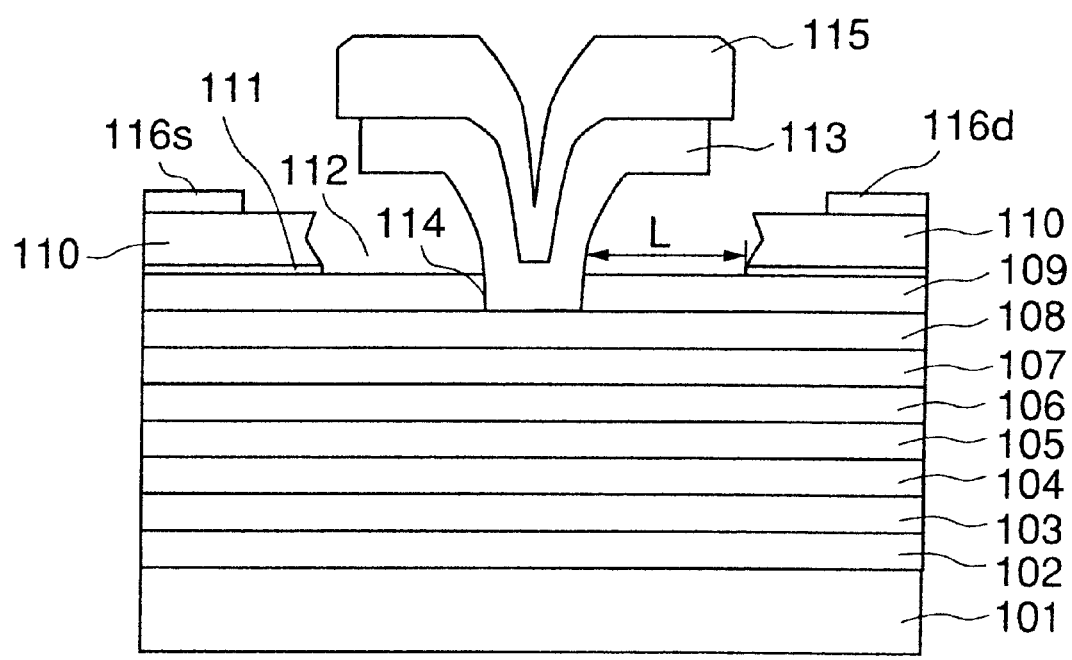
FIG. 1 is a sectional view showing an example of a compound semiconductor device in the prior art.
Figure 13:
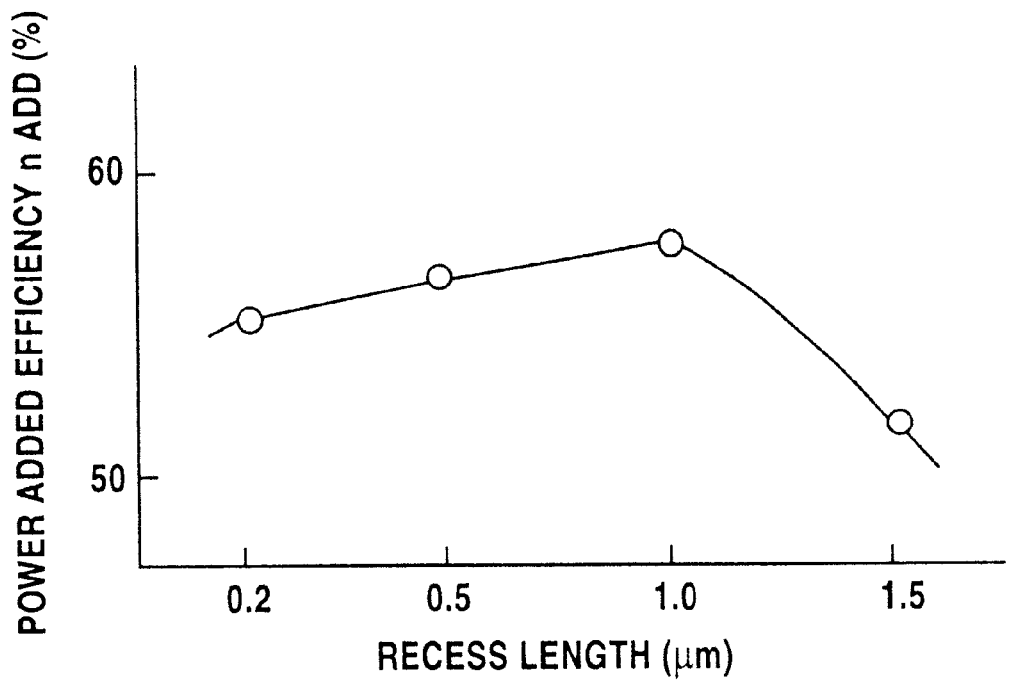
FIG. 13 is a characteristic view showing a relationship between a recess length and a power added efficiency of the compound semiconductor device in the prior art.

For example, according to the examination conducted by the inventors of the present invention, it has been confirmed that, if the gate length is set to less than 0.5 $\mu$m in the HEMT shown in FIG. 1, a characteristic shown in FIG. 13 can be derived when a relationship between a recess length and a power added efficiency is examined. In this case, the recess length L indicates a length L from an edge of the first recess 112 between the drain electrode 116d and the gate electrode 115 to an edge of the second recess 114 in FIG. 1.

According to FIG. 13, in the compound semiconductor device in which the recess length L is set to more than 1 $\mu$m, the power adding efficiency ($\eta$ add) tends to decrease smaller as the recess length L becomes longer and longer. On the contrary, in the range where the recess length L is smaller than 1 $\mu$m, the power added efficiency ($\eta$ add) also tends to decrease smaller as the recess length L becomes shorter and shorter. In other words, in the HEMT in the prior art, the power added efficiency ($\eta$ add) is maximized in the structure in which the recess length L is set to 1 $\mu$m.

In principle, it can be understood theoretically that, since the distance between the drain electrode 116d and the gate electrode 115 become longer according to increase in the recess length L, the ON-resistance is increased and thus the power added efficiency ($\eta$ add) is decreased.

However, since the power added efficiency ($\eta$ add) cannot be kept high by merely reducing the ON-resistance in the situation that the recess length L is less than 1 $\mu$m, some treatment is needed.

Therefore, in the following embodiment, the HEMT which enables the transistor, in which the recess length spread over ranges from the gate electrode to the cap layer is less than 1 $\mu$m, to keep the high power added efficiency ($\eta$ add) will be explained hereinbelow.

FIGS. 14A to 14K are sectional views showing steps of manufacturing a HEMT according to an eighth embodiment of the present invention.

Figure 14A:
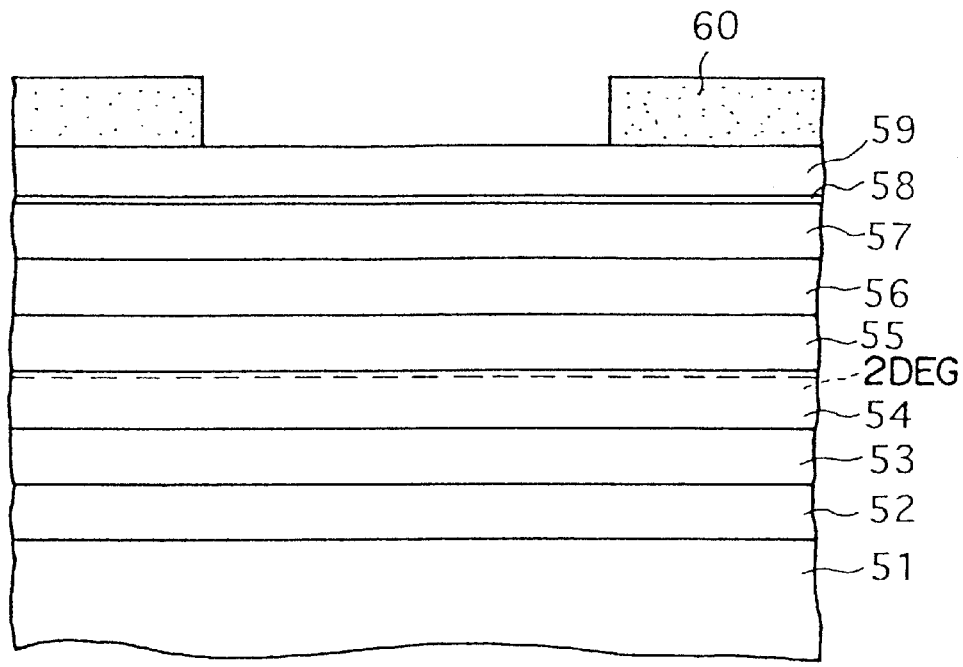
FIGS. 14A to 14K are sectional views showing steps of manufacturing a HEMT according to an eighth embodiment of the present invention.

To begin with, as shown in FIG. 14A, a plurality of compound semiconductor layers constituting the HEMT are formed on a semi-insulating gallium-arsenide (GaAs) substrate 51.

In FIG. 14A, a first buffer layer 52 made of undoped gallium-arsenic (GaAs), a second buffer layer 53 made of undoped aluminum-gallium-arsenide (AlGaAs), an electron travel layer (channel layer) 54 made of undoped indium-gallium-arsenide (InGaAs), an electron supply layer (carrier supply layer) 55 made of n$^+$-AlGaAs, a Schottky layer 56 made of n-AlGaAs, an n-GaAs buried layer 57, an n$^+$-AlGaAs etching stopper layer 58, and an n$^+$-GaAs cap layer 59 are formed in sequence on a GaAs substrate 51. As the growth method for these layers, there are the MOVPE method, the MBE method, etc. In FIG. 14A, 2-DEG denotes a two-dimensional electron gas.

Thicknesses of these layers are not limited particularly. By way of example, a thickness of the GaAs first buffer layer 52 is 150 nm, a thickness of the AlGaAs second buffer layer 53 is 500 nm, a thickness of the InGaAs electron travel layer 54 is 14 nm, a thickness of the AlGaAs electron supply layer 55 is 20 nm, a thickness of the AlGaAs Schottky layer 56 is 20 nm, a thickness of the GaAs buried layer 57 is 30 nm, a thickness of the AlGaAs etching stopper layer 58 is 5 nm, and a thickness of the GaAs cap layer 59 is 80 nm.

As for the impurity concentration of the impurity doped layers, for example, the silicon concentration of the AlGaAs electron supply layer 55 is more than $1 \times 10^{18}$ atoms/cm$^3$, the silicon concentration of the AlGaAs Schottky layer 56 is about $4 \times 10^{16}$ atoms/cm$^3$, the silicon concentration of the GaAs buried layer 57 is about $4 \times 10^{16}$ atoms/cm$^3$, the silicon concentration of the AlGaAs etching stopper layer 58 is more than $2 \times 10^{18}$ atoms/cm$^3$, and the silicon concentration of the GaAs cap layer 59 is more than $1 \times 10^{18}$ atoms/cm$^3$. The GaAs buried layer 57 may be formed of the undoped layer.

After the formation of the above semiconductor layers has been finished, first resist 60 is coated on the cap layer 59 and then the first resist 60 is patterned by exposing and developing the first resist 60 so as to cover the source/drain re-ions.

Figure 14B:
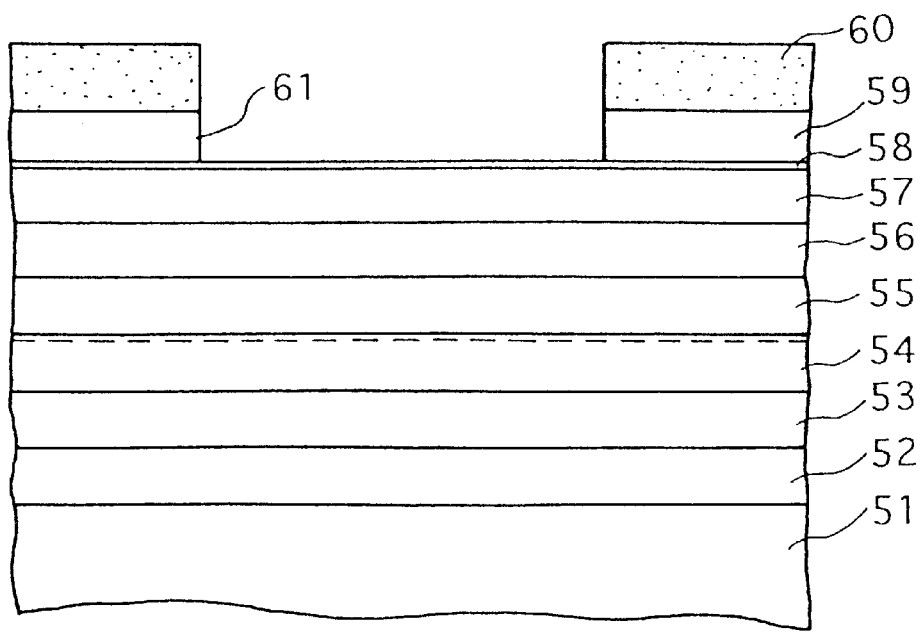

The GaAs cap layer 59 is then etched by using the first resist 60 as a mask to thus form a first recess 61, as shown in FIG. 14B.

The GaAs cap layer 59 is etched by the plasma etching method using a chlorine gas or a chlorine compound gas. Since an etching rate becomes slow quickly at a point of time when the AlGaAs etching stopper layer 58 formed below the GaAs cap layer 59 is exposed, stop of the etching of the GaAs cap layer 59 can be easily controlled. The first recess 61 is formed in the GaAs cap layer 59 by this etching.

Figure 14C:
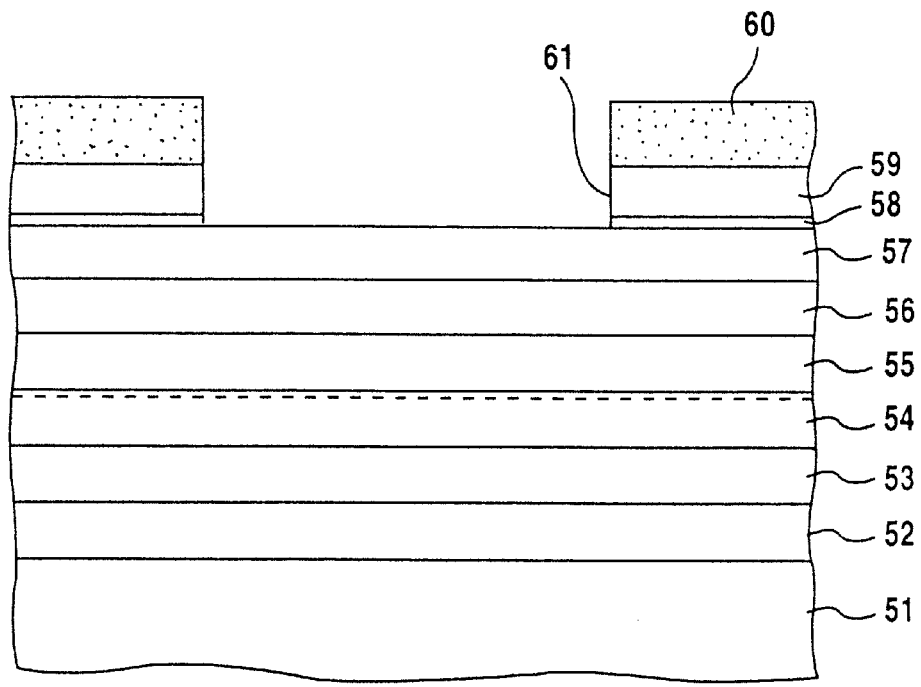

As shown in FIG. 14C, while using the first resist 60 as a mask, the AlGaAs etching stopper layer 58 being exposed from the first recess 61 is then removed by using ammonia, nitric acid, or hydrogen fluoride, for example.

Figure 14D:
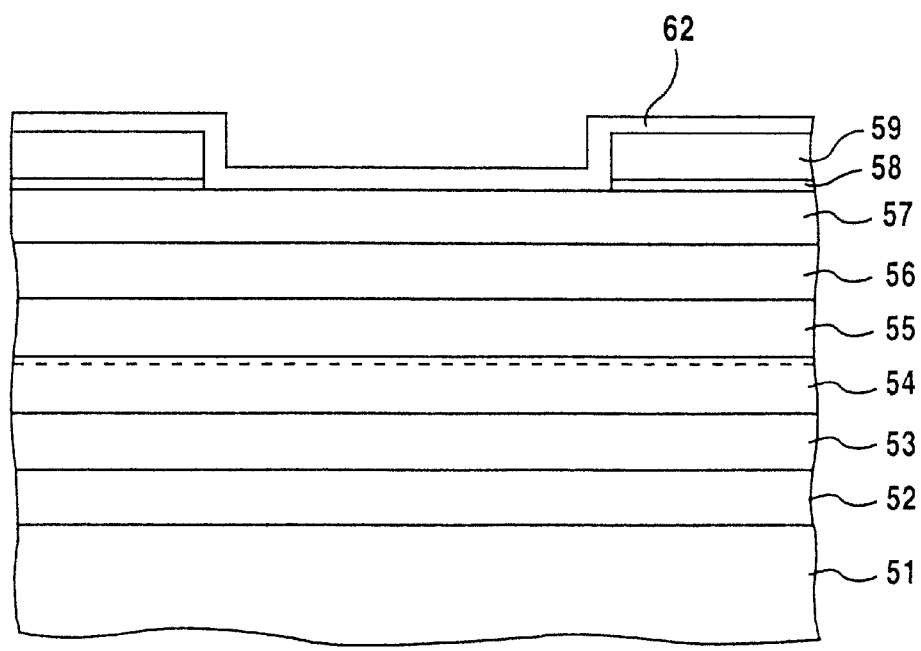

The first resist 60 is then removed and, as shown in FIG. 14D, a silicon nitride film 62 is grown on exposed surfaces of the GaAs cap layer 59 and the GaAs buried layer 57, and exposed side surface of the AlGaAs etching stopper layer 58 by the plasma CVD method to have a thickness of 30 nm to 100 nm. For example, growth conditions of the silicon nitride film 62 arc that a mixed gas of silane (SiH$_4$) and nitrogen (N$_2$) is employed as a growth gas, a growth temperature is set to 250° C. to 350° C., preferably 300° C., a pressure in the growth atmosphere is set to 0.5 to 2.0 Torr, preferably about 1 Torr, a power density is set to 0.05 to 0.11 W/cm$^2$, and a growth rate is set to 5 to 15 nm/min.

After the silicon nitride film 62 has been formed, the silicon nitride film 62 and underlying compound semiconductor layers 51 to 59 are heated at the temperature of 500° C. to 700° C., as shown in FIG. 14D.

Figure 14E:
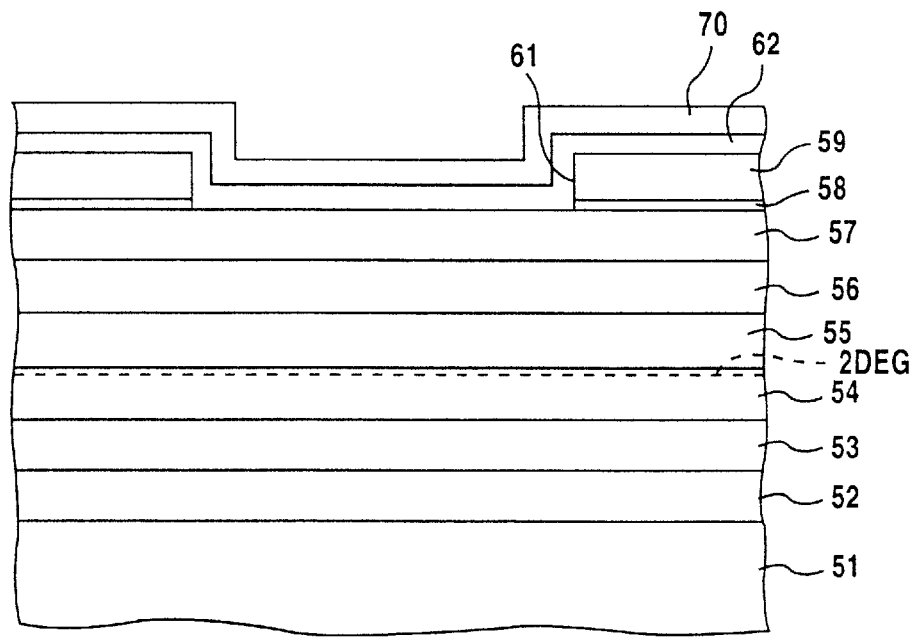

A silicon oxide film (SiO$_2$) 70 of 250 nm to 300 nm thickness is grown on the silicon nitride film 62 by the CVD method, as shown in FIG. 14E.

Figure 14F:
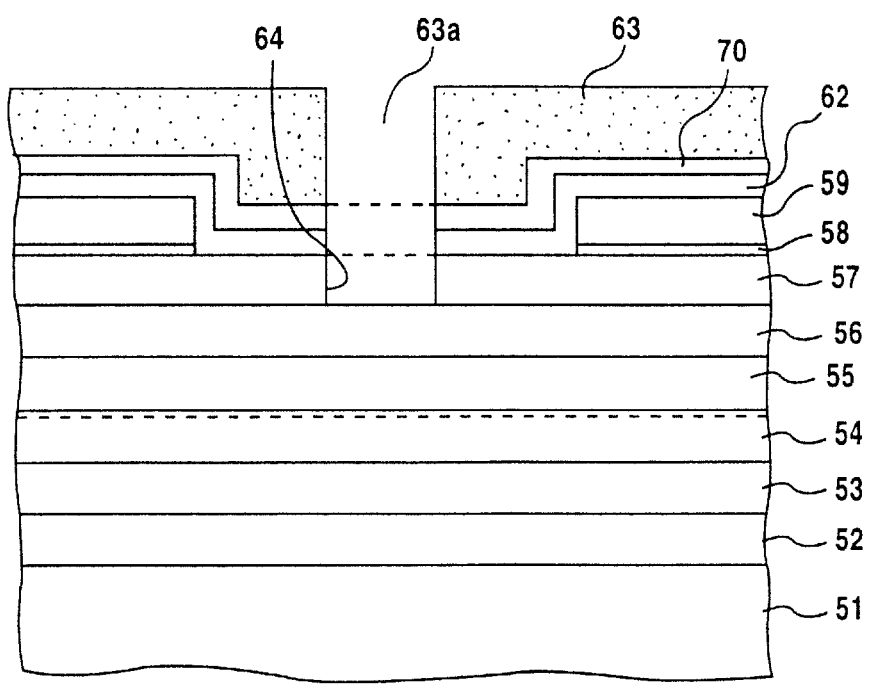

Second resist 63 is then coated on the silicon oxide film 70 and, as shown in FIG. 14F, a window 63a is then formed in the gate region by exposing and developing the second resist 63. An opening portion 62a is then formed by etching the silicon oxide film 70 and the silicon nitride film 62 being exposed from the window 63a by virtue of the reactive ion etching. There is SF$_6$ as an etching gas employed in etching the silicon oxide film 70 and the silicon nitride film 62, for example.

Like the formation of the first recess 61, the GaAs buried layer 57 is etched via the opening portion 62a by the plasma etching method using the chlorine gas or the chlorine compound gas, whereby a second recess 64 is formed in the GaAs buried layer 57.

Figure 14G:
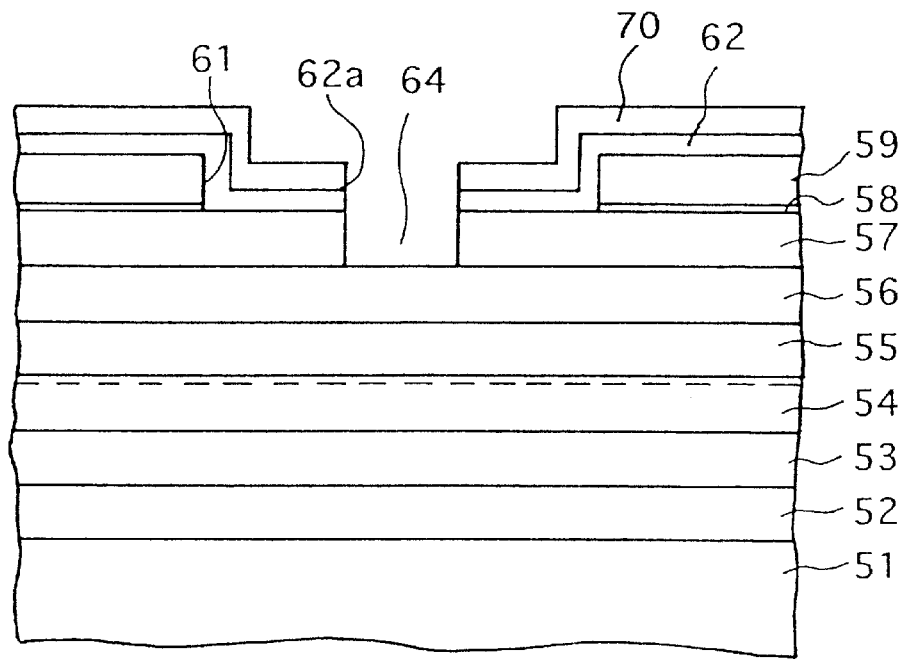

As shown in FIG. 14G, the second resist 63 is removed.

Figure 14H:
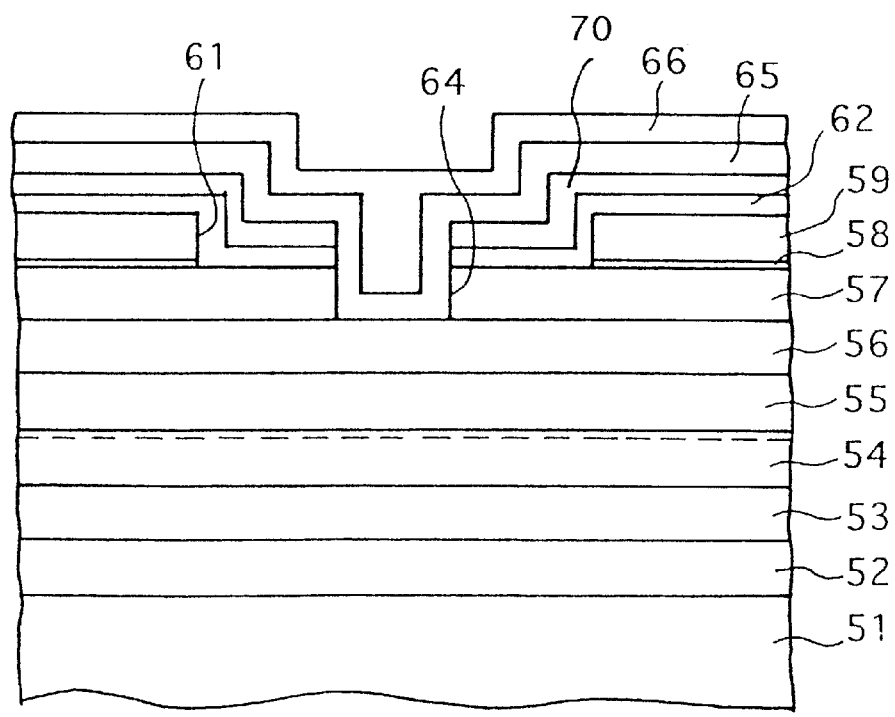

As shown in FIG. 14H, a tungsten suicide (WSi) layer 65 and a gold (Au) layer 66 are then formed on the silicon nitride film 62 and in the opening portion 62a and the second recess 64 by sputtering to have a thickness of 150 nm and 500 nm respectively.

Figure 14I:
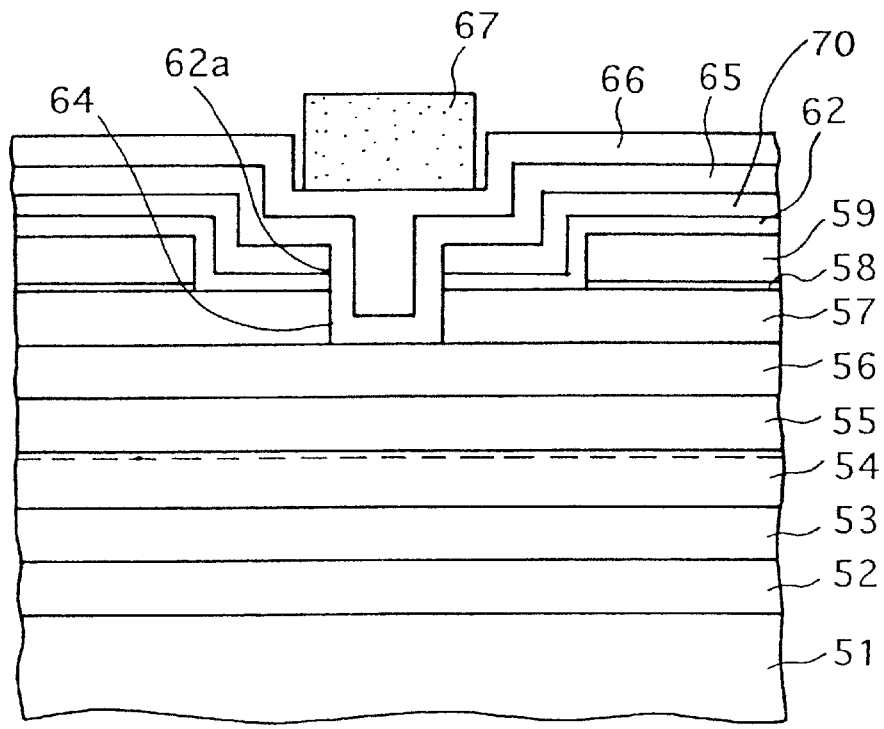

Third resist 67 is then coated on the Au layer 66 and then, as shown in FIG. 14I, a pattern for covering the gate region is formed by exposing and developing the third resist 67.

While using the third resist 67 as a mask, the Au layer 66 and the WSi layer 65 are etched to be left in the second recess 64 and its peripheral area.

Figure 14J:
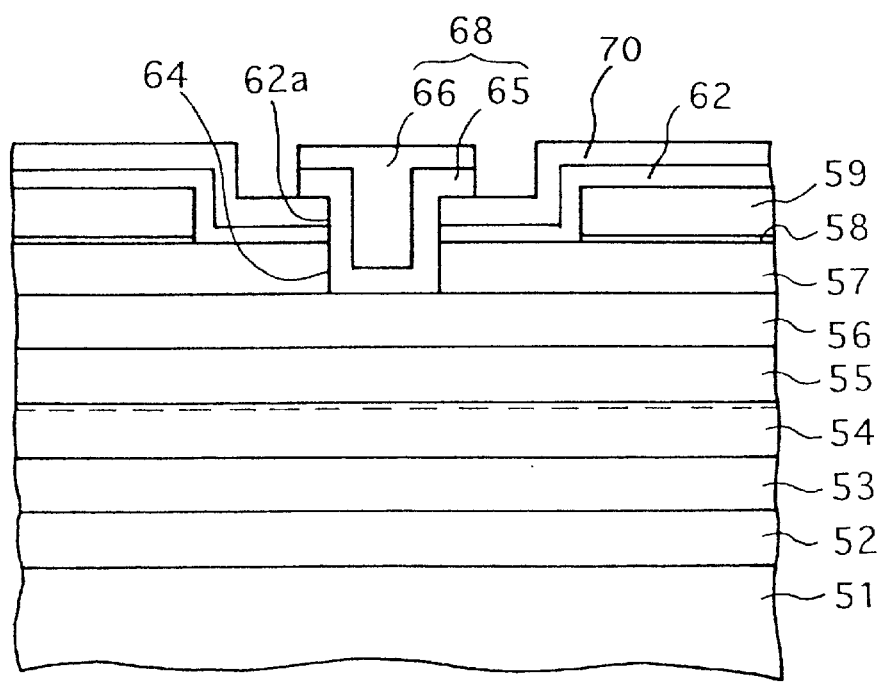

Thus, as shown in FIG. 14J, a T-sectional shaped gate electrode 68, which is Schottky-contacted to the AlGaAs Schottky layer 56 via the opening portion 62a and the second recess 64, is formed of the Au layer 66 and the WSi layer 65. A length of the gate electrode 68 between the source region and the drain region, i.e., the gate length, is set to less than 0.5 μm.

The silicon nitride film 62 and the silicon oxide film 70 are then patterned by photolithography technique using the resist (not shown), so that two opening portions 62s, 62d are formed on the GaAs cap layer 59 on both sides of the gate electrode 68. A multi-layered conductive film is formed by growing gold-germanium (AuGe)/nickel (Ni)/gold (Au) in sequence by virtue of evaporation.

Figure 14K:
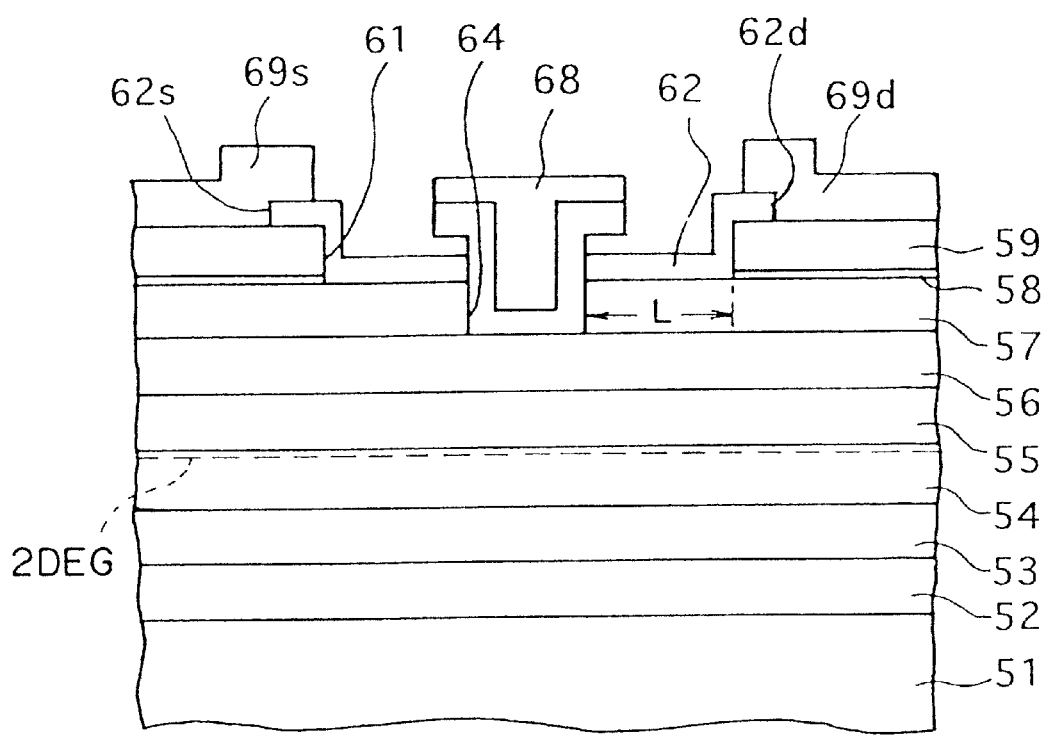

The multi-layered conductive film is patterned by the lift-off method. Thus, as shown in FIG. 14K, the multi-layered conductive film left in two opening portions 62s, 62d can be employed as a drain electrode 69d and a source electrode 69s.

After this, only the silicon oxide film 70 is removed by hydrogen fluoride. At this time, since the etching rate of the silicon nitride film 62 formed under the silicon oxide film 70 by the hydrogen fluoride is small (1/10 or less than the silicon oxide), removal of the silicon nitride film 62 can be prevented.

In the HEMT or MESFET which is operated at a low frequency, there are the cases where the silicon oxide film 70 is not removed.

Accordingly, a basic stricture of the HEMT is completed.

Figure 15:
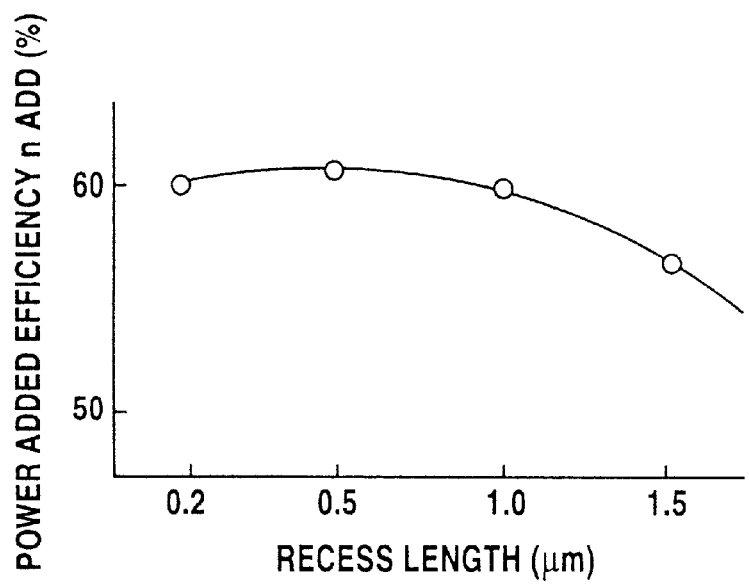
FIG. 15 is a characteristic view showing a relationship between a recess length and a power added efficiency in the HEMT according to the eighth embodiment of the present invention.

In the above steps of manufacturing the HEMT, the GaAs buried layer 57 is heated at the temperature of 500 to 700° C. after the silicon nitride film 62 has been formed. In this case, it has been found that, as shown in FIG. 15, the power adding efficiency is not lowered in the HEMT which is subjected to such heating even if the recess length L is reduced to less than 1.0 μm and that the power adding efficiency can be improved rather than the case where the recess length L is more than 1.0 μm.

In order to study the cause, for the HEMT which is heated at the temperature of 500 to 700° C. after the silicon nitride film 62 has been formed on the GaAs buried layer 57, a relationship between the recess length L and a three-terminal breakdown voltage Vdsx in the HEMT has been examined. In addition, a relationship between the recess length L and the three-terminal breakdown voltage Vdsx in the HEMT without the silicon nitride film in the prior art has been examined.

Figure 16:
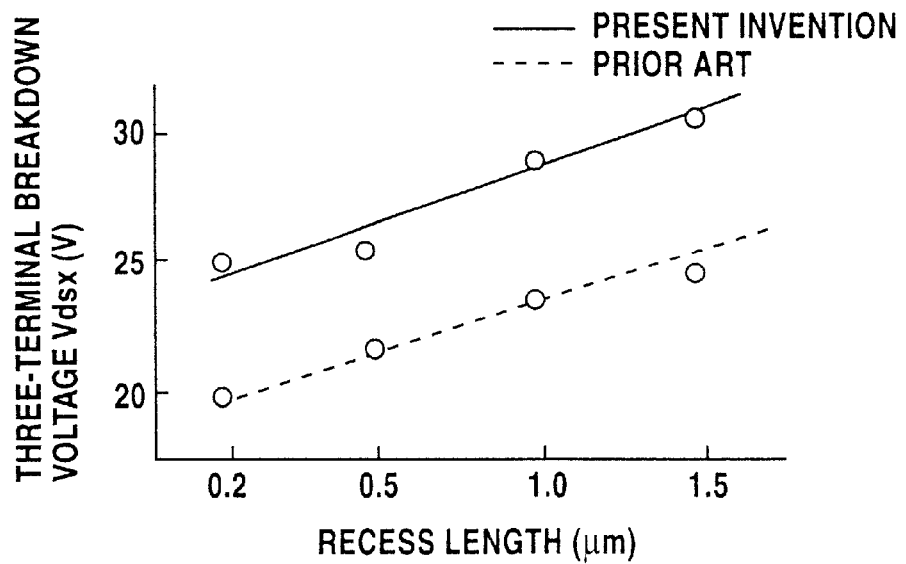
FIG. 16 is a characteristic view showing a relationship between the recess length and a three-terminal breakdown voltage in the HEMT according to the eighth embodiment of the present invention and a relationship between the recess length and the three-terminal breakdown voltage in the HEMT in the prior art.

Such relationships are shown in FIG. 16. It has been found that the three-terminal breakdown voltage Vdsx of the eighth embodiment of the present invention is higher than that of the prior art.

Accordingly, it has been found that heating of the HEMT at the temperature of 500 to 700° C. after the GaAs buried layer 57 has been covered with the silicon nitride film 62 can make the three-terminal breakdown voltage Vdsx higher, and as a result make the three-terminal breakdown voltage Vdsx higher.

The reason for enhancing the three-terminal breakdown voltage Vdsx in the eighth embodiment of the present invention in this manner will be supposed as follows.

Figure 17A:
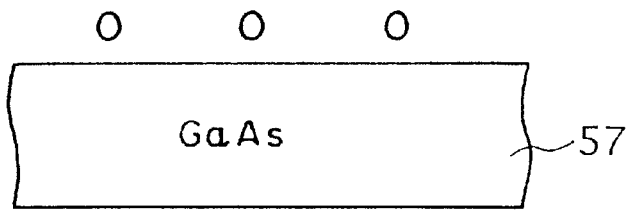
FIGS. 17A to 17E are sectional views showing change in a GaAs layer employed in steps of manufacturing the HEMT in the prior art.
Figure 17B:
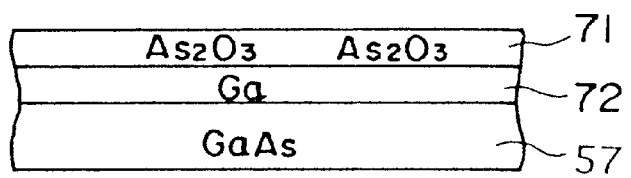

First, in the prior art, when, as shown in FIG. 17A, a surface of the GaAs buried layer 57 is exposed to the oxygen containing atmosphere, GaAs reacts with oxygen (O) to then grow an $As_2O_3$ layer 71, as shown in FIG. 17B. In this case, since As constituting the $As_2O_3$ layer 71 is supplied from the GaAs buried layer 57 below the $As_2O_3$ layer 71, a gallium (Ga) layer 72 appears beneath the $As_2O_3$ layer 71.

Figure 17C:
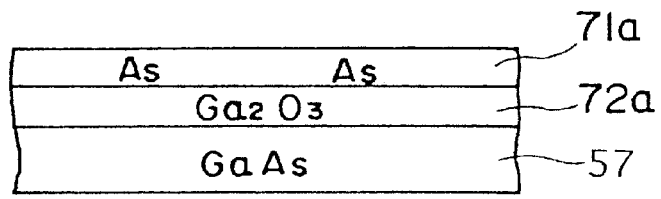

In addition, since the oxygen can bond more easily with the gallium than the arsenic, the oxygen in the $As_2O_3$ layer 71 is bonded with the gallium (Ga). Thus, as shown in FIG. 17C, the Ga layer 72 is changed into a $Ga_2O_3$ layer 72a and also the $As_2O_3$ layer 71 is changed into an As layer 71a.

Because the As layer 71a has higher conductivity than the GaAs buried layer 57, the carriers are ready to shift via the As layer 71a to thereby make the three-terminal breakdown voltage (Vdsx) lower.

Figure 17D:
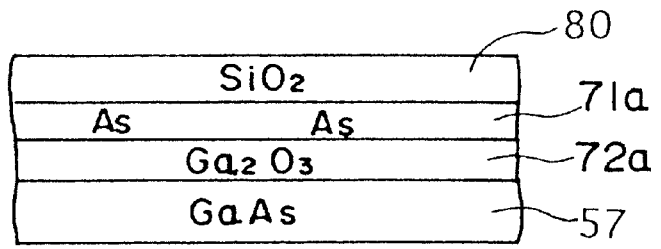
Figure 17E:
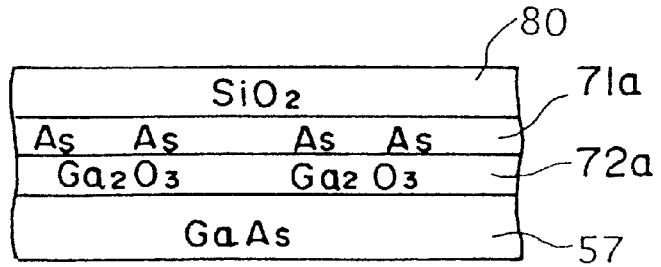

As shown in FIG. 17D, if the As layer 71 a is covered with an oxygen containing film 80 such as $SiO_2$, the oxygen in the oxygen containing film 80 diffuses downward to then increase an amount of the As layer 71a and the $Ga_2O_3$ layer 72a. Thus, the three-terminal breakdown voltage (Vdsx) is decreased further more.

Figure 18A:
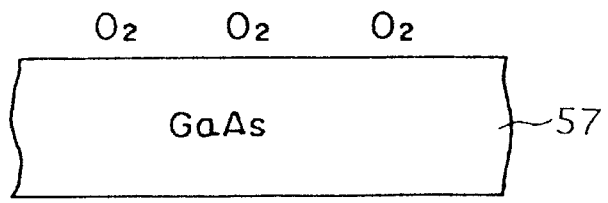
FIGS. 18A to 18E are sectional views showing change in a GaAs layer employed in steps of manufacturing the HEMT according to the eighth embodiment of the present invention.
Figure 18B:
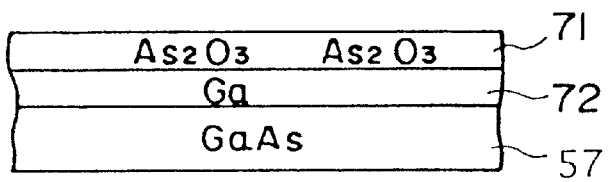
Figure 18C:
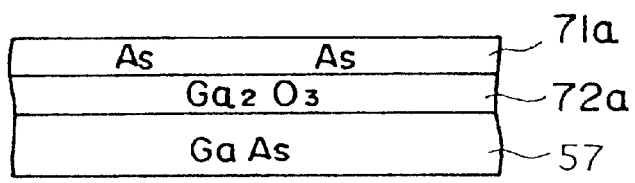

On the contrary, as shown in FIGS. 18A to 18C, in the eighth embodiment of the present invention, the As layer 71a and the $Ga_2O_3$ layer 72a appear on the surface of the GaAs buried layer 57 because of the reaction with the oxygen in the oxygen containing atmosphere. The processes are similar to FIGS. 17A to 17C until now.

Figure 18D:
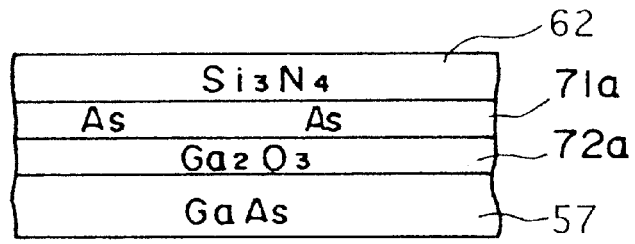
Figure 18E:
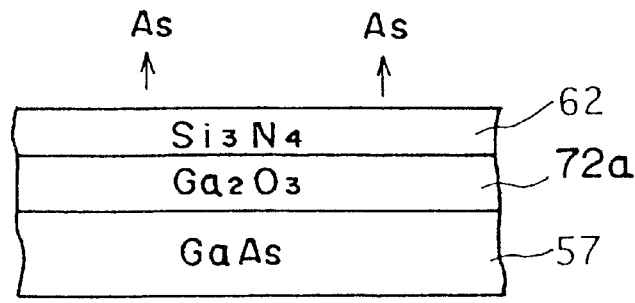

As shown in FIG. 18D, a resultant structure is heated at the temperature of 500 to 700° C. after the As layer 71a has been covered with the silicon nitride ($Si_3N_4$) film 62. Thus, as shown in FIG. 18E, As in the As layer 71a volatilizes to the outside through the silicon nitride film 62. As a result, merely the $Ga_2O_3$ layer 72a of high resistance exists substantially between the GaAs buried layer 57 and the silicon nitride film 62.

Therefore, since the As layer 71a produced on the GaAs buried layer 57 disappears, it is difficult for the carriers to shift through the overlying layer of the GaAs buried layer 57, so that the three-terminal breakdown voltage (Vdsx) is increased.

In this manner, it has been found that, after the GaAs buried layer 57 has been covered with the silicon nitride film 62, heating of the GaAs buried layer 57 at the temperature of 500 to 700° C. is important to improve the power added efficiency.

By the way, the reason why the temperature at which the GaAs buried layer 57 is heated after the silicon nitride film 62 has been formed is set in the range of 500 to 700° C. can be given based on following experimental results.

Figure 19:
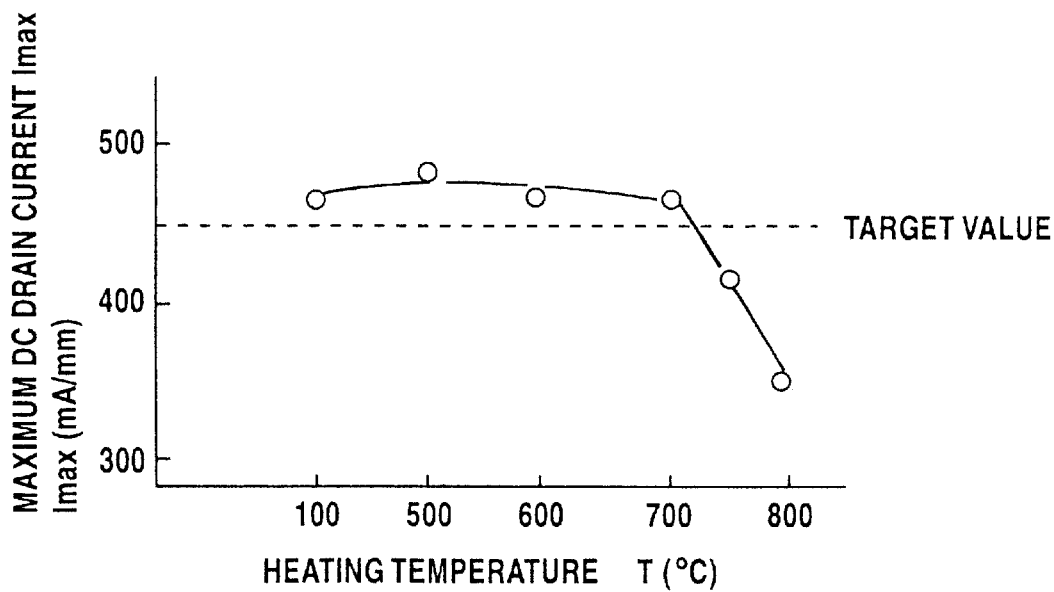
FIG. 19 is a characteristic view showing a relationship between a heating temperature and a maximum DC drain current after a GaAs buried layer has been covered with a silicon nitride film, in steps of manufacturing the HEMT according to the eighth embodiment of the present invention.

First of all, a result shown in FIG. 19 has been derived when a relationship between a heating temperature T and a drain current Imax is examined if a DC voltage is applied to the gate electrode 68 of the HEMT shown in FIG. 14K. In other words, the drain current Imax is reduced if the heating temperature T is set higher than 700° C., and the drain current Imax becomes lower than the target drain current value of 450 mA/mm at the temperature slightly higher than 700° C. The reason why the drain current is reduced lower as the heating temperature is increased higher than 700° C. is that the carriers are difficult to shift because semiconductor crystal in the 2-DEG region of the channel layer is destroyed.

Figure 20:
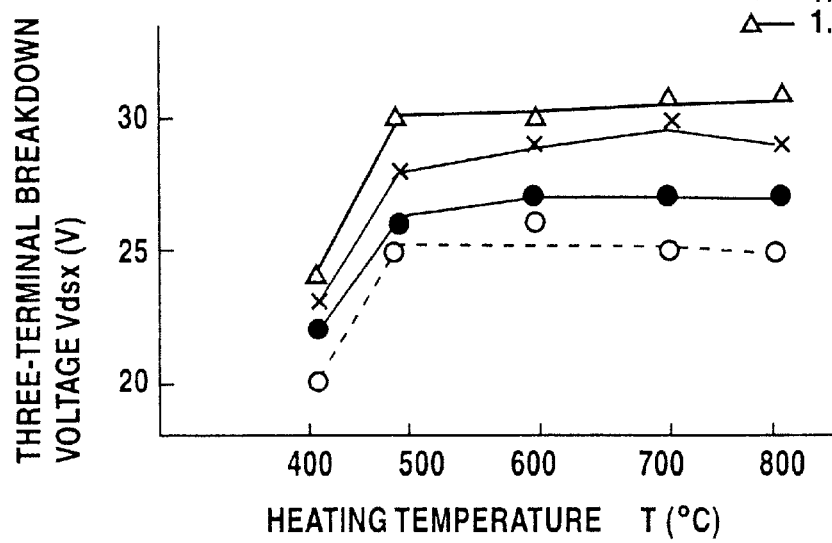
FIG. 20 is a characteristic view showing a relationship between a heating temperature and a three-terminal breakdown voltage of the HEMT in which the GaAs buried layer has been covered with the silicon nitride film, in steps of manufacturing the HEMT according to the eighth embodiment of the present invention.

When a relationship between the heating temperature T and the three-terminal breakdown voltage (Vdsx) of HEMT is examined, as shown in FIG. 20, the three-terminal breakdown voltage (Vdsx) is lowered regardless of the recess length if the heating temperature T is reduced to less than 500° C. This is due to the phenomenon shown in FIGS. 18D and 18E, i.e., the fact that the As layer 71a between the GaAs buried layer 57 and the silicon nitride film 62 hardly disappears and thus the leakage current is increased at the time when the high voltage is applied between the source and the drain, to thereby reduce the three-terminal breakdown voltage (Vdsx).

Figure 21:
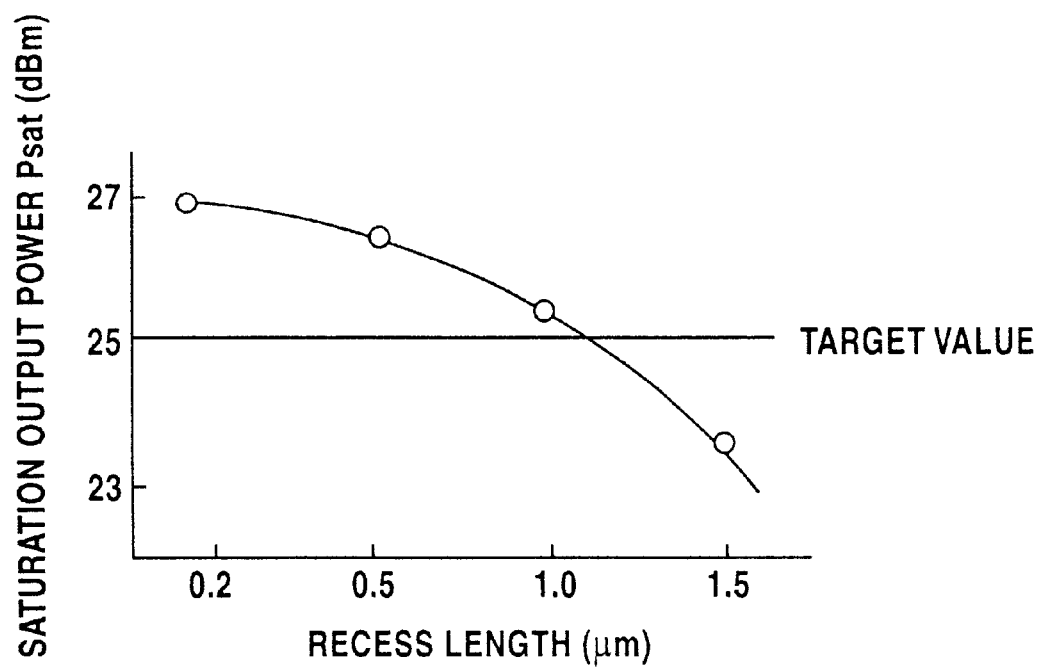
FIG. 21 is a characteristic view showing a relationship between a recess length and a saturation output power of the HEMT according to the eighth embodiment of the present invention.

Next, under the conditions that the gate width is 600 $\mu$m and the frequency of the gate applied signal is 20 GHz, when a relationship between the recess length and a saturation output power (P sat) of the HEMT according to the eighth embodiment of the present invention is examined, the output becomes higher than the target value 25 dBm in the range where the recess length is shorter than 1.0 $\mu$m, as shown in FIG. 21. As a result, in the HEMT according to the eighth embodiment of the present invention, the power added efficiency can be increased.

In the eighth embodiment of the present invention, the first buffer layer is formed of the GaAs single layer, but it is not limited to such single layer. For example, as shown in FIG. 22, a multi-layered structure in which the undoped GaAs layer 52a and the undoped AlGaAs layer 52b are stacked alternatively may be employed. Also, the electron supply layer 55 is formed only on the electron travel layer 54 in the above HEMT, but the second electron supply layer 55a is formed below the electron travel layer 54, as illustrated in FIG. 22.

As described above, according to the present invention, the first compound semiconductor layer whose donor concentration is set to $1 \times 10^{16}$ atoms/cm$^3$ to $1 \times 10^{17}$ atoms/cm$^3$ is provided between the cap layer and the carrier supply layer. Therefore, according to the donor of such concentration, the holes being separated in the channel layer can be prevented from reaching the surface of the first compound semiconductor layer, whereby contraction of the surface depletion layer can be suppressed and thus generation of the walk-out phenomenon can be prevented.

In this case, since the donor concentration is set to less than $1 \times 10^{17}$ atoms/cm$^3$, the situation that the gate breakdown voltage is easily reduced because of high concentration of donor in the first compound semiconductor layer cannot be brought about.

According to another invention, since the bandgap of the Schottky layer formed on the carrier supply layer is set higher than that of the carrier supply layer, the energy barrier between the gate electrode and the Schottky layer can be enhanced to thus improve the gate breakdown voltage.

According to still another invention, the GaAs buried layer is heated after the silicon nitride film has been formed on the GaAs buried layer, in which the second recess is formed, in the region located on the inside of the first recess formed in the cap layer.

Thus, even if the gallium oxide layer and the arsenic layer are generated because the surface of the GaAs buried layer is oxidized, such arsenic layer can be discharged into the outside through the silicon nitride film by heating, so that the three-terminal breakdown voltage (Vdsx) can be increased. The power adding efficiency can also be improved since the three-terminal breakdown voltage (Vdsx) can be increased.

As a result, if the interval between the first recess and the second recess is set to less than 1 $\mu$m, reduction in the power adding efficiency can be prevented.

What is claimed is:

1. A method of manufacturing a compound semiconductor device comprising the steps of:

forming a channel layer on a semiconductor substrate;

forming a carrier supply layer, which supplies carriers to the channel layer, on the channel layer;

forming a first gallium-arsenide layer on the carrier supply layer;

forming a silicon nitride film on the first gallium-arsenide layer;

heating the first gallium-arsenide layer which is covered with the silicon nitride film;

forming an opening portion by selectively etching the silicon nitride film on a gate region;

forming a gate electrode on the gate region of the carrier supply layer via the opening portion;

forming a source opening portion and a drain opening portion on or above the first gallium-arsenide layer; and forming a source electrode on or above the first gallium-arsenide layer via the source opening portion and forming a drain electrode on or above the first gallium-arsenide layer via the drain opening portion.

2. A method of manufacturing a compound semiconductor device according to claim 1, further comprising the steps of:

forming a Schottky semiconductor layer between the carrier supply layer and the first gallium-arsenide layer;

forming a second gallium-arsenide layer on the first gallium-arsenide layer;

forming a first recess by etching the second gallium-arsenide layer in the gate region and an environment of the same; and forming a second recess, which is in the first recess, by etching the first gallium-arsenide layer via the opening portion.

3. A method of manufacturing a compound semiconductor device according to claim 2, further comprising the steps of:

forming an aluminum-arsenide etching stopper layer between the first gallium-arsenide layer and the second gallium-arsenide layer; and wherein etching of the second gallium-arsenide layer in forming the first recess is stopped at a point of time when the aluminum-gallium-arsenide etching stopper layer is exposed, and the aluminum-gallium-arsenide etching stopper layer which appears from the first recess is removed after the first recess has been formed.

4. A method of manufacturing a compound semiconductor device according to claim 1, wherein a temperature employed to heat the first gallium-arsenide layer is set in a range of 500 to 700° C.

* * * * *